United States Patent
Granger-Jones

(10) Patent No.: US 9,419,775 B2
(45) Date of Patent: Aug. 16, 2016

(54) TUNABLE DIPLEXER

(71) Applicant: RF Micro Devices, Inc., Greensboro, NC (US)

(72) Inventor: Marcus Granger-Jones, Scotts Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 53 days.

(21) Appl. No.: 14/444,128

(22) Filed: Jul. 28, 2014

(65) Prior Publication Data

US 2014/0334362 A1 Nov. 13, 2014

Related U.S. Application Data

(63) Continuation-in-part of application No. 13/852,309, filed on Mar. 28, 2013, now Pat. No. 9,203,596.

(60) Provisional application No. 61/858,941, filed on Jul. 26, 2013, provisional application No. 61/708,792, filed on Oct. 2, 2012, provisional application No. 61/789,474, filed on Mar. 15, 2013.

(51) Int. Cl.
| | |
|---|---|
| *H04L 5/00* | (2006.01) |
| *H04L 5/08* | (2006.01) |
| *H03J 3/20* | (2006.01) |
| *H04L 5/14* | (2006.01) |

(52) U.S. Cl.
CPC ... *H04L 5/08* (2013.01); *H03J 3/20* (2013.01); *H03J 2200/10* (2013.01); *H04L 5/001* (2013.01); *H04L 5/0023* (2013.01); *H04L 5/14* (2013.01)

(58) Field of Classification Search
None
See application file for complete search history.

(56) References Cited

U.S. PATENT DOCUMENTS

| | | |
|---|---|---|
| 4,498,057 A | 2/1985 | Noro |
| 5,502,422 A * | 3/1996 | Newell ............... H01P 1/2056 333/202 |
| 6,091,970 A | 7/2000 | Dean |
| 6,128,474 A | 10/2000 | Kim et al. |
| 6,405,018 B1 | 6/2002 | Reudink et al. |
| 6,961,368 B2 | 11/2005 | Dent et al. |
| 7,187,945 B2 | 3/2007 | Ranta et al. |

(Continued)

FOREIGN PATENT DOCUMENTS

CN 201374693 Y 12/2009

OTHER PUBLICATIONS

Notice of Allowance for U.S. Appl. No. 13/852,527, mailed Aug. 14, 2015, 8 pages.

(Continued)

*Primary Examiner* — Afshawn Towfighi
(74) *Attorney, Agent, or Firm* — Withrow & Terranova, P.L.L.C.

(57) ABSTRACT

A tunable diplexer includes a high band port, a low band port, an antenna port, a high pass filter, and a low pass filter. The high pass filter is coupled between the high band port and the antenna port, and is configured to pass signals within a high pass band between the high band port and the antenna port. The high pass filter includes a high band path stop band zero, which is configured to selectively attenuate signals within a high band path stop band. The low pass filter is coupled between the low band port and the antenna port, and is configured to pass signals within a low pass band between the low band port and the antenna port. The low pass filter includes a low band path stop band zero, which is configured to selectively attenuate signals within a low band path stop band.

23 Claims, 14 Drawing Sheets

(56) References Cited

U.S. PATENT DOCUMENTS

| | | | |
|---|---|---|---|
| 7,212,788 | B2 | 5/2007 | Weber et al. |
| 7,251,499 | B2 | 7/2007 | Ellä et al. |
| 7,289,080 | B1 | 10/2007 | Bohlman |
| 7,596,357 | B2 | 9/2009 | Nakamata et al. |
| 7,864,491 | B1 | 1/2011 | Bauder et al. |
| 7,872,547 | B2 | 1/2011 | Song et al. |
| 7,973,645 | B1 | 7/2011 | Moretti et al. |
| 7,996,003 | B2 | 8/2011 | Maeda et al. |
| 8,208,867 | B2 | 6/2012 | Lum et al. |
| 8,437,438 | B2 | 5/2013 | Kuwahara |
| 8,565,701 | B2 | 10/2013 | Sanchez et al. |
| 8,571,489 | B2 | 10/2013 | Mikhemar et al. |
| 8,634,029 | B2 | 1/2014 | Pugel |
| 8,718,582 | B2 | 5/2014 | See et al. |
| 8,774,067 | B2 | 7/2014 | Rousu et al. |
| 8,942,644 | B2 | 1/2015 | Schell |
| 2005/0245202 | A1 | 11/2005 | Ranta et al. |
| 2005/0277387 | A1 | 12/2005 | Kojima et al. |
| 2006/0012425 | A1 | 1/2006 | Ohnishi et al. |
| 2006/0025171 | A1 | 2/2006 | Ly et al. |
| 2006/0240785 | A1 | 10/2006 | Fischer |
| 2006/0276132 | A1 | 12/2006 | Sheng-Fuh et al. |
| 2006/0293005 | A1 | 12/2006 | Hara et al. |
| 2007/0002984 | A1* | 1/2007 | Hoon ............... H04B 1/3805 375/350 |
| 2007/0216481 | A1 | 9/2007 | Jimenez et al. |
| 2007/0280185 | A1* | 12/2007 | McFarland ........... H03H 7/0153 370/338 |
| 2008/0003797 | A1 | 1/2008 | Kim |
| 2009/0180403 | A1 | 7/2009 | Tudosoiu |
| 2009/0286501 | A1 | 11/2009 | Rousu et al. |
| 2009/0303007 | A1 | 12/2009 | Ryou et al. |
| 2010/0079347 | A1 | 4/2010 | Hayes et al. |
| 2010/0099366 | A1 | 4/2010 | Sugar et al. |
| 2010/0248660 | A1 | 9/2010 | Bavisi et al. |
| 2010/0291888 | A1 | 11/2010 | Hadjichristos et al. |
| 2010/0317297 | A1 | 12/2010 | Kratochwil et al. |
| 2011/0001877 | A1 | 1/2011 | Pugel |
| 2011/0069645 | A1 | 3/2011 | Jones |
| 2011/0241782 | A1 | 10/2011 | Clifton |
| 2011/0241787 | A1 | 10/2011 | Mastovich |
| 2011/0250926 | A1 | 10/2011 | Wietfeldt et al. |
| 2012/0235735 | A1 | 9/2012 | Spits et al. |
| 2012/0275350 | A1 | 11/2012 | Kwok |
| 2013/0122824 | A1 | 5/2013 | Schell |
| 2013/0230080 | A1 | 9/2013 | Gudem et al. |
| 2013/0320803 | A1 | 12/2013 | Maeda |
| 2013/0321095 | A1 | 12/2013 | Lam et al. |
| 2014/0051372 | A1 | 2/2014 | Shoshan et al. |
| 2014/0073371 | A1 | 3/2014 | Mujtaba et al. |
| 2014/0105079 | A1 | 4/2014 | Bengtsson et al. |
| 2014/0329475 | A1 | 11/2014 | Ell et al. |
| 2015/0036563 | A1 | 2/2015 | Hurd et al. |

OTHER PUBLICATIONS

Notice of Allowance for U.S. Appl. No. 13/852,309, mailed Jul. 23, 2015, 7 pages.
Notice of Allowance for U.S. Appl. No. 14/051,601, mailed Aug. 14, 2015, 8 pages.
Notice of Allowance for U.S. Appl. No. 13/929,987, mailed Jun. 23, 2015, 8 pages.
Corrected Notice of Allowance for U.S. Appl. No. 13/929,987, mailed Jul. 21, 2015, 5 pages.
Non-Final Office Action for U.S. Appl. No. 13/950,432, mailed Jul. 28, 2015, 14 pages.
Non-Final Office Action for U.S. Appl. No. 13/952,880, mailed Jul. 29, 2015, 17 pages.
Corrected Notice of Allowance for U.S. Appl. No. 14/051,601, mailed Sep. 16, 2015, 5 pages.
Non-Final Office Action for U.S. Appl. No. 14/133,024, mailed Sep. 15, 2015, 28 pages.
Author Unknown, "3rd Generation Partnership Project; Technical Specification Group Radio Access Network; Evolved Universal Terrestrial Radio Access (E-UTRA); User Equipment (UE) Radio Transmission and Reception (Release 11)," Technical Specification 36.101, Version 11.1.0, Jun. 2012, 3GPP Organizational Partners, 336 pages.
Author Unknown, "MIPI Alliance Application Note for Analog Control Interface—Envelope Tracking," ACI-ET, Version 1.0.0, Release 19, Oct. 4, 2012, 1 page.
Djoumessi, Erick Emmanuel, et al., "Electronically Tunable Diplexer for Frequency-Agile Transceiver Front End," 2010 IEEE MTT-S International Microwave Symposium Digest (MTT), May 23-28, 2010, pp. 1472-1475.
Valkenburg, M.E, Van. "12.2 Pole Reciprocation." Analog Filter Design. New York: CBS College Publishing, 1982. pp. 327-333.
Wang, Zhao-Ming, et al., "The Design of a Symmetrical Diplexer Composed of Canonical Butterworth Two-Port Networks," 1988 IEEE International Symposium on Circuits and Systems, vol. 2, Jun. 7-9, 1988, pp. 1179-1182.
Williams, Arthur Bernard, et al., Electronic Filter Design Handbook, 3rd. ed. New York: McGraw-Hill, 1995. pp. 3.1-4.7 and 11.72-11.73.
Zverev, Anatol I., Handbook of Filter Synthesis, New York: John Wiley & Sons, 1967. pp. 192-193.
Notice of Allowance for U.S. Appl. No. 13/460,861, mailed Jan. 30, 2014, 9 pages.
Notice of Allowance for U.S. Appl. No. 13/045,604, mailed May 17, 2013, 11 pages.
Non-Final Office Action for U.S. Appl. No. 13/045,621, mailed May 31, 2013, 13 pages.
Notice of Allowance for U.S. Appl. No. 13/045,621, mailed Sep. 24, 2013, 10 pages.
Non-Final Office Action for U.S. Appl. No. 13/852,527, mailed Sep. 30, 2014, 19 pages.
Final Office Action for U.S. Appl. No. 13/852,527, mailed Jan. 12, 2015, 21 pages.
Non-Final Office Action for U.S. Appl. No. 13/942,778, mailed Jan. 22, 2015, 5 pages.
Non-Final Office Action for U.S. Appl. No. 13/852,309, mailed Oct. 14, 2014, 10 pages.
Non Final Office Action for U.S. Appl. No. 13/944,972, mailed Nov. 13, 2014, 10 pages.
Final Office Action for U.S. Appl. No. 13/852,309, mailed Feb. 18, 2015, 12 pages.
Notice of Allowance and Examiner-Initiated Interview Summary for U.S. Appl. No. 14/052,221, mailed Feb. 26, 2015, 9 pages.
Non-Final Office Action for U.S. Appl. No. 13/929,987, mailed Jan. 30, 2015, 11 pages.
Non-Final Office Action for U.S. Appl. No. 13/852,527, mailed Apr. 23, 2015, 23 pages.
Notice of Allowance for U.S. Appl. No. 13/942,778, mailed May 14, 2015, 10 pages.
Advisory Action for U.S. Appl. No. 13/852,309, mailed Apr. 29, 2015, 4 pages.
Advisory Action for U.S. Appl. No. 13/852,309, mailed May 27, 2015, 4 pages.
Notice of Allowance for U.S. Appl. No. 13/944,972, mailed Apr. 13, 2015, 7 pages.
Non-Final Office Action for U.S. Appl. No. 14/051,601, mailed May 5, 2015, 6 pages.
Corrected Notice of Allowability for U.S. Appl. No. 13/852,309, mailed Oct. 9, 2015, 5 pages.
Corrected Notice of Allowability for U.S. Appl. No. 13/852,309, mailed Nov. 3, 2015, 5 pages.
Non-Final Office Action for U.S. Appl. No. 14/011,802, mailed Sep. 30, 2015, 65 pages.
Non-Final Office Action for U.S. Appl. No. 13/943,969, mailed Nov. 13, 2015, 15 pages.
Non-Final Office Action for U.S. Appl. No. 13/953,808, mailed Nov. 13, 2015, 18 pages.
Final Office Action for U.S. Appl. No. 13/950,432, mailed Jan. 14, 2016, 16 pages.
Final Office Action for U.S. Appl. No. 13/952,880, mailed Jan. 14, 2016, 20 pages.
Author Unknown, "MIMO," Wikipedia.com, last modified Nov. 2, 2011, 5 pages, https://en.wikipedia.org/wiki/MIMO.

(56) References Cited

OTHER PUBLICATIONS

Nguyen, Si, "Business Made Simple MIMO-OFDM in Long Term Evolution (LTE)," Nortel, Oct. 18, 2006, 12 pages.
Advisory Action for U.S. Appl. No. 13/950,432, mailed Apr. 28, 2016, 3 pages.
Advisory Action for U.S. Appl. No. 13/952,880, mailed Apr. 28, 2016, 3 pages.
Final Office Action for U.S. Appl. No. 14/133,024, mailed Apr. 8, 2016, 20 pages.
Final Office Action for U.S. Appl. No. 14/011,802, mailed Mar. 29, 2016, 69 pages.
Final Office Action for U.S. Appl. No. 13/943,969, mailed Apr. 12, 2016, 18 pages.
Final Office Action for U.S. Appl. No. 13/953,808, mailed Apr. 13, 2016, 19 pages.
Non-Final Office Action for U.S. Appl. No. 13/939,941, mailed Jul. 1, 2016, 10 pages.
Advisory Action for U.S. Appl. No. 14/133,024, mailed Jul. 8, 2016, 5 pages.

* cited by examiner

| OPERATING BAND | UPLINK (UL) OPERATING BAND | DOWNLINK (DL) OPERATING BAND | DUPLEX MODE |
|---|---|---|---|
| 1 | 1920-1980 | 2110-2170 | FDD |
| 2 | 1850-1910 | 1930-1990 | FDD |
| 3 | 1710-1785 | 1805-1880 | FDD |
| 4 | 1710-1755 | 2110-2155 | FDD |
| 5 | 824-849 | 869-894 | FDD |
| 6 | 830-840 | 865-875 | FDD |
| 7 | 2500-2570 | 2620-2690 | FDD |
| 8 | 880-915 | 925-960 | FDD |
| 9 | 1749.9-1784.9 | 1844.9-1879.9 | FDD |
| 10 | 1710-1770 | 2110-2170 | FDD |
| 11 | 1427.9-1447.9 | 1475.9-1495.9 | FDD |
| 12 | 698-716 | 728-746 | FDD |
| 13 | 777-787 | 746-756 | FDD |
| 14 | 788-798 | 758-768 | FDD |
| 15 | RESERVED | RESERVED | - |
| 16 | RESERVED | RESERVED | - |
| 17 | 704-716 | 734-746 | FDD |
| 18 | 815-830 | 860-875 | FDD |
| 19 | 830-845 | 875-890 | FDD |
| 20 | 832-862 | 791-821 | FDD |
| 21 | 1447.9-1462.9 | 1495.9-1510.9 | FDD |
| 22 | 3410-3500 | 3510-3600 | FDD |
| ... | | | |
| 33 | 1900-1920 | 1900-1920 | TDD |
| 34 | 2010-2025 | 2010-2025 | TDD |
| 35 | 1850-1910 | 1850-1910 | TDD |
| 36 | 1930-1990 | 1930-1990 | TDD |
| 37 | 1910-1930 | 1910-1930 | TDD |
| 38 | 2570-2620 | 2570-2620 | TDD |
| 39 | 1880-1920 | 1880-1920 | TDD |
| 40 | 2300-2400 | 2300-2400 | TDD |
| 41 | 3400-3600 | 3400-3600 | TDD |

*FIG. 1*
(RELATED ART)

TUNABLE DIPLEXER

RELATED APPLICATION

This application claims the benefit of U.S. provisional patent application No. 61/858,941, filed Jul. 26, 2013. This application is a continuation-in-part of U.S. patent application Ser. No. 13/852,309, filed Mar. 28, 2013, now U.S. Pat. No. 9,203,596, which claims the benefit of U.S. provisional patent application No. 61/708,792, filed Oct. 2, 2012, and U.S. provisional patent application No. 61/789,474, filed Mar. 15, 2013, the disclosures of which are hereby incorporated herein by reference in their entirety.

FIELD OF THE DISCLOSURE

The present disclosure relates to diplexer filters for use in a mobile device. Specifically, the present disclosure relates to diplexer filters that are tunable to allow the pass and stop bands of the diplexer to be changed.

BACKGROUND

Modern mobile telecommunications standards continue to demand increasingly greater rates of data exchange (data rates). One way to achieve a high data rate in a mobile device is through the use of carrier aggregation. Carrier aggregation allows a single mobile device to aggregate bandwidth across one or more operating bands in the wireless spectrum. The increased bandwidth achieved as a result of carrier aggregation allows a mobile device to obtain higher data rates than have previously been available.

FIG. 1 shows a table describing a number of wireless communications bands in the wireless spectrum. One or more of the wireless communications bands may be used, for example, in a CDMA, GSM, LTE, or LTE-advanced equipped mobile device. The first column indicates the operating band number for each one of the operating bands. The second and third columns indicate the uplink and downlink frequency bands for each one of the operating bands, respectively. Finally, the fourth column indicates the duplex mode for each one of the operating bands. In non-carrier aggregation configurations, a mobile device will generally communicate using a single portion of the uplink or downlink frequency bands within a single operating band. In carrier aggregation applications, however, a mobile device may aggregate bandwidth across a single operating band or multiple operating bands in order to increase the data rate of the device.

FIG. 2A shows a diagram representing a conventional, non-carrier aggregation configuration for a mobile device. In the conventional configuration, a mobile device communicates using a single portion of the wireless spectrum 10 within a single operating band 12. Under the conventional approach, the data rate of the mobile device is constrained by the limited available bandwidth.

FIGS. 2B-2D show diagrams representing a variety of carrier aggregation configurations for a mobile device. FIG. 2B shows an example of contiguous, intra-band carrier aggregation, in which the aggregated portions of the wireless spectrum 14A and 14B are located directly adjacent to one another and are in the same operating band 16. FIG. 2C shows an example of non-contiguous intra-band carrier aggregation, in which the aggregated portions of the wireless spectrum 18A and 18B are located within the same operating band 20, but are not directly adjacent to one another. Finally, FIG. 2D shows an example of inter-band carrier aggregation, in which the aggregated portions of the wireless spectrum 22A and 22B are located in different operating bands 24, 26. A modern mobile device should be capable of supporting each one of the previously described carrier aggregation configurations.

The use of carrier aggregation may pose unique problems for the front end circuitry in a mobile device. For instance, a mobile device using carrier aggregation may require two or more antennas. The use of more than one antenna may complicate the design of the front-end switching circuitry within the mobile device. Additionally, the use of carrier aggregation across certain operating bands may cause undesirable interference between transmit and receive circuitry in a mobile device front end that renders the mobile device unusable in these operating bands.

FIG. 3 shows conventional front end circuitry 28 for use in a mobile terminal. The front end circuitry 28 includes antenna switching circuitry 30, a diplexer 32, and an antenna 34. The antenna switching circuitry 30 includes low band switching circuitry 36 and high band switching circuitry 38. The low band switching circuitry 36 is adapted to couple one of a first plurality of RF front end ports 40 to the antenna 34 through the diplexer 32. The high band switching circuitry 38 is adapted to couple one of a second plurality of RF front end ports 42 to the antenna 34 through the diplexer 32. The diplexer 32 includes a low band port 44 coupled to the low band switching circuitry 36, a high band port 46 coupled to the high band switching circuitry 38, and an antenna port 48 coupled to the antenna 34. The diplexer 32 is adapted to pass high band signals falling within a high pass band between the high band port 46 and the antenna port 48, pass low band signals falling within a low pass band between the low band port 44 and the antenna port 48, and attenuate signals outside of the high and low pass bands. Although effective at selectively placing the antenna 34 in communication with the appropriate RF front end port, the conventional front end circuitry 28 shown in FIG. 3 is not suitable for carrier aggregation applications that require multiple antennas.

FIG. 4 shows conventional front end circuitry 50 for use in a mobile terminal with two antennas. The front end circuitry 50 includes antenna switching circuitry 52, a first diplexer 54A, a second diplexer 54B, a first antenna 56A, and a second antenna 56B. The antenna switching circuitry 52 includes first antenna switching circuitry 52A and second antenna switching circuitry 52B. The first antenna switching circuitry 52A includes first low band switching circuitry 58, first high band switching circuitry 60, second low band switching circuitry 62, and second high band switching circuitry 64. The first low band switching circuitry 58 and the first high band switching circuitry 60 are adapted to selectively couple one of a first plurality of RF front end ports 66 to the second antenna switching circuitry 52B through the first diplexer 54A. The second low band switching circuitry 62 and the second high band switching circuitry 64 are adapted to selectively couple one of a second plurality of RF front end ports 68 to the second antenna switching circuitry 52B through the second diplexer 54B. The second antenna switching circuitry 52B includes antenna selection circuitry 70, which is adapted to selectively place the first antenna 56A and the second antenna 56B in communication with either the first diplexer 54A or the second diplexer 54B.

The antenna switching circuitry 52 may comprise a plurality of transistors and other assorted passive components. As is well known in the art, non-linearity of the transistors and other passive components within the antenna switching circuitry 52 may generate harmonic distortion about a passing signal. In certain carrier aggregation configurations, the generated harmonic distortion can cause desensitization of receive circuitry in the conventional front end circuitry 50 illustrated in FIG. 4. For example, the conventional front end circuitry 50 may be unusable in a carrier aggregation configuration using bands 3 and 8 (CA 3-8). In a CA 3-8 configuration, the conventional front end circuitry 50 will couple one of the second plurality of RF front end ports 68 corresponding with the band 8 transmit port to the antenna selection circuitry 70 in order to transmit a carrier signal between 880-915 MHz. As the carrier signal passes through the first low band switching circuitry 58, harmonic distortion is generated. The carrier signal and harmonic distortion travel through the first diplexer 54A, where the harmonic distortion is effectively filtered. However, as the carrier signal travels through the antenna selection circuitry 70, additional harmonic distortion is generated.

Because at least a portion of the second harmonic of the band 8 uplink band (1760-1830 MHz) falls within the band 3 downlink band (1805-1880 MHz), components of the harmonic distortion about the second harmonic are within the high pass band of the first diplexer 54A, and a portion of the harmonic distortion will be delivered to the first high band switching circuitry 60. Further, because the front end circuitry 50 is configured to simultaneously transmit on band 8 and receive on band 3, one of the first plurality of RF front end ports 66 corresponding with the band 3 receive port will be coupled to the first diplexer 54A through the first high band switching circuitry 60. Accordingly, a portion of the distorted band 8 transmit signal about the second harmonic will be delivered to the band 3 receive circuitry, where it will cause desensitization. Additionally, the harmonic distortion in the carrier signal will be presented to the antennas 56A and 56B, thereby degrading the quality of the wireless signal. As a result of the desensitization of the receiver circuitry, the performance of the front end circuitry 50 illustrated in FIG. 4 may suffer in a CA 3-8 configuration.

As an additional example, the conventional front end circuitry 50 will also experience problems in carrier-aggregation applications using bands 4 and 17 (CA 4-17), because the third harmonic of a band 17 transmit signal (2112-2148 MHz) falls within a band 4 receive signal (2110-2155 MHz). The problem with the conventional front end circuitry 50 may occur in any carrier aggregation configuration using operating bands in which the harmonic components of the carrier signal fall within the frequency band of the receive signal. The limited combination of operating bands usable in a carrier aggregation configuration by the conventional front end circuitry 50 illustrated in FIG. 4 may impede the performance and versatility of a mobile device. Accordingly, front end switching circuitry for a mobile device with two or more antennas is needed that is suitable for carrier aggregation applications across all bands.

FIG. 5 shows a conventional diplexer 72 for use in the front end circuitry 28 and 50 shown in FIGS. 3 and 4. The conventional diplexer 72 is based on a fourth order Butterworth response, and includes an antenna port 74, a low band port 76, a high band port 78, a high pass filter 80, and a low pass filter 82. The high pass filter 80 includes a first high band inductor L1_HB coupled between the high band port 78 and ground, a first high band capacitor C1_HB coupled between the high band port 78 and a first high band node 81, a second high band inductor L2_HB coupled between the first high band node 81 and ground, and a second high band capacitor C2_HB coupled between the first high band node 81 and the antenna port 74. The low pass filter 82 includes a first low band capacitor C1_LB coupled between the low band port 76 and ground, a first low band inductor L1_LB coupled between the low band port 76 and a first low band node 83, a second low band capacitor C2_LB coupled between the first low band node 83 and ground, and a second low band inductor L2_LB coupled between the first low band node 83 and the antenna port 74. The conventional diplexer 72 is designed to pass high band signals falling within a high pass band between the antenna port 74 and the high band port 78, pass low band signals falling within a low pass band between the antenna port 74 and the low band port 76, and attenuate signals outside of the high and low pass bands. The conventional diplexer 72 allows a mobile terminal to transmit and receive a high band signal and a low band signal simultaneously, thereby increasing the data rate of the mobile device. Although effective at separating low and high band signals, the conventional diplexer 72 is limited to fixed pass bands for the low and high band signals. In certain carrier aggregation applications, the rigidity of the conventional diplexer 72 may degrade the performance of a mobile device into which it is incorporated. Carrier aggregation applications may demand more precise control over the high and low pass bands, greater stop band attenuation, and lower insertion loss. To achieve the desired pass and stop bands, a seventh or eighth order Butterworth response may be required according to the conventional design. Such a high order filter would be complex to implement, and would further introduce a high amount of insertion loss into the signal path to the antenna. Accordingly, a diplexer is needed that is capable of providing the necessary pass bands for the high band and low band signals while maintaining a desirable stop band attenuation and insertion loss for carrier aggregation applications.

SUMMARY

The present disclosure relates to diplexer filters that are tunable to allow the pass and stop bands of the diplexer to be changed. In one embodiment, a tunable diplexer includes a high band port, a low band port, an antenna port, a high pass filter, and a low pass filter. The high pass filter is coupled between the high band port and the antenna port, and is configured to pass signals within a high pass band between the high band port and the antenna port, while attenuating signals outside the high pass band. The high pass filter includes a high band path stop band zero, which is configured to selectively attenuate signals within a high band path stop band. The low pass filter is coupled between the low band port and the antenna port, and is configured to pass signals within a low pass band between the low band port and the antenna port, while attenuating signals outside the low pass band. The low pass filter includes a low band path stop band zero, which is configured to selectively attenuate signals within a low band path stop band.

According to one embodiment, the tunable diplexer is operable in two modes. In the first mode of operation, the tunable diplexer is configured to adjust the high band path stop band zero to attenuate the fundamental frequency of a low band transmit signal. Further, in the first mode of operation, the tunable diplexer may be configured to adjust the low band path stop band zero in order to mitigate or eliminate harmonic distortion. In a second mode of operation, the tunable diplexer is configured to adjust the high band path stop band zero and/or the low band path stop band zero in order to reduce insertion loss.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 is a table showing a number of wireless communications bands within the wireless spectrum.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 2A:
FIGS. 2A-2D are diagrams showing a variety of carrier aggregation configurations for use in a mobile terminal.
Figure 2B:
Figure 2C:
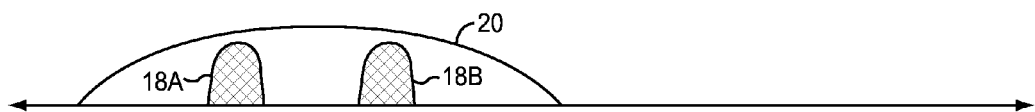
Figure 2D:
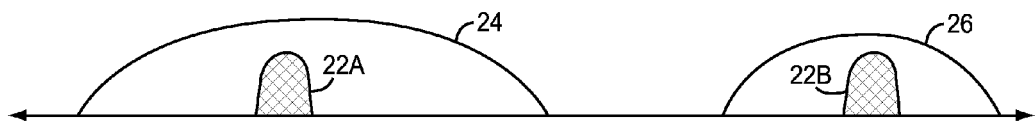
Figure 3:
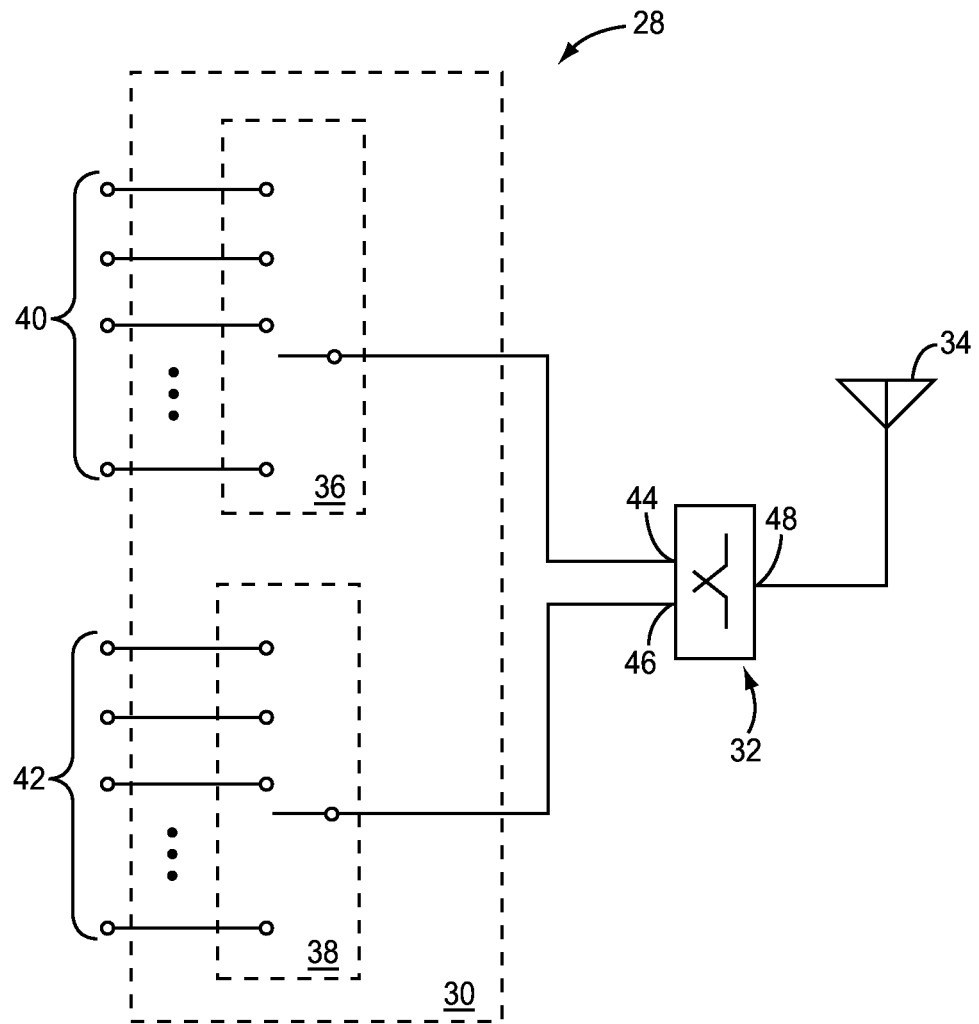
FIG. 3 is a schematic representation of conventional front end switching circuitry.
Figure 4:
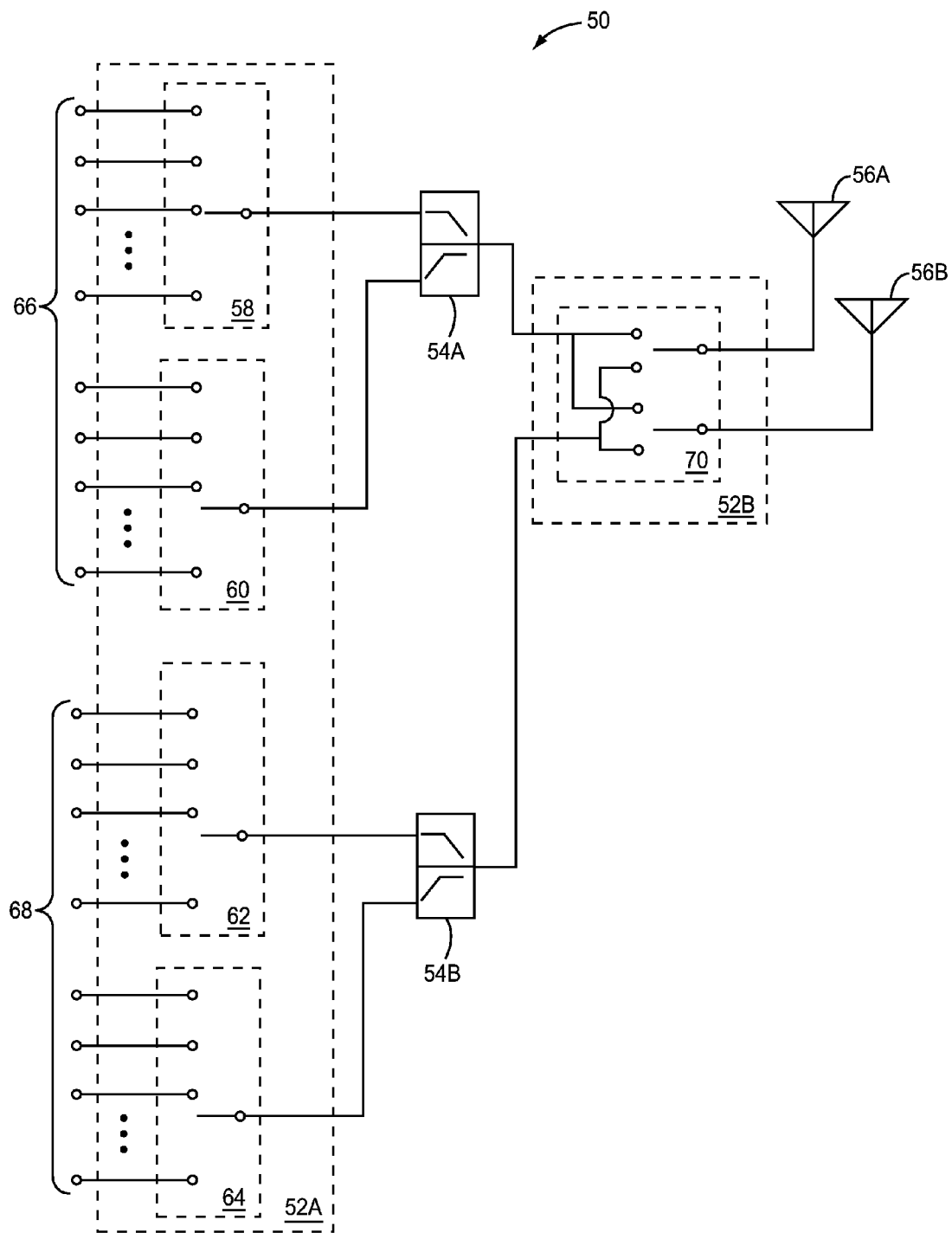
FIG. 4 is a schematic representation of conventional front end switching circuitry for use with two antennas.
Figure 5:
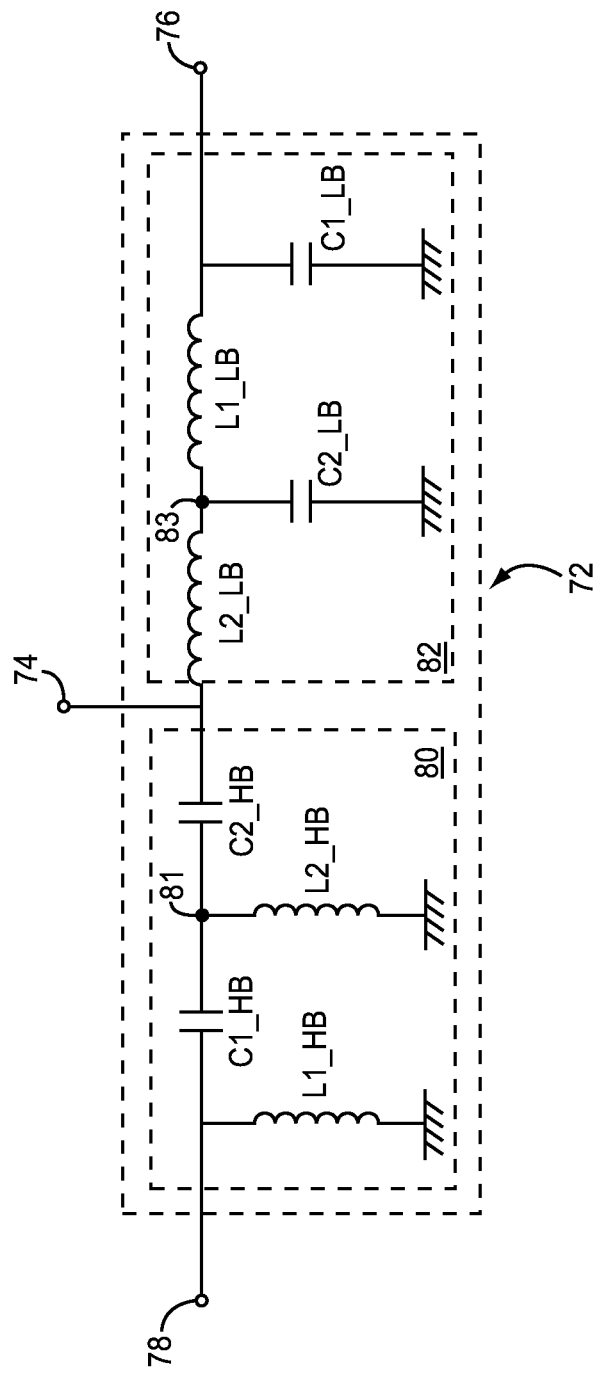
FIG. 5 is a schematic representation of a conventional diplexer.
Figure 6:
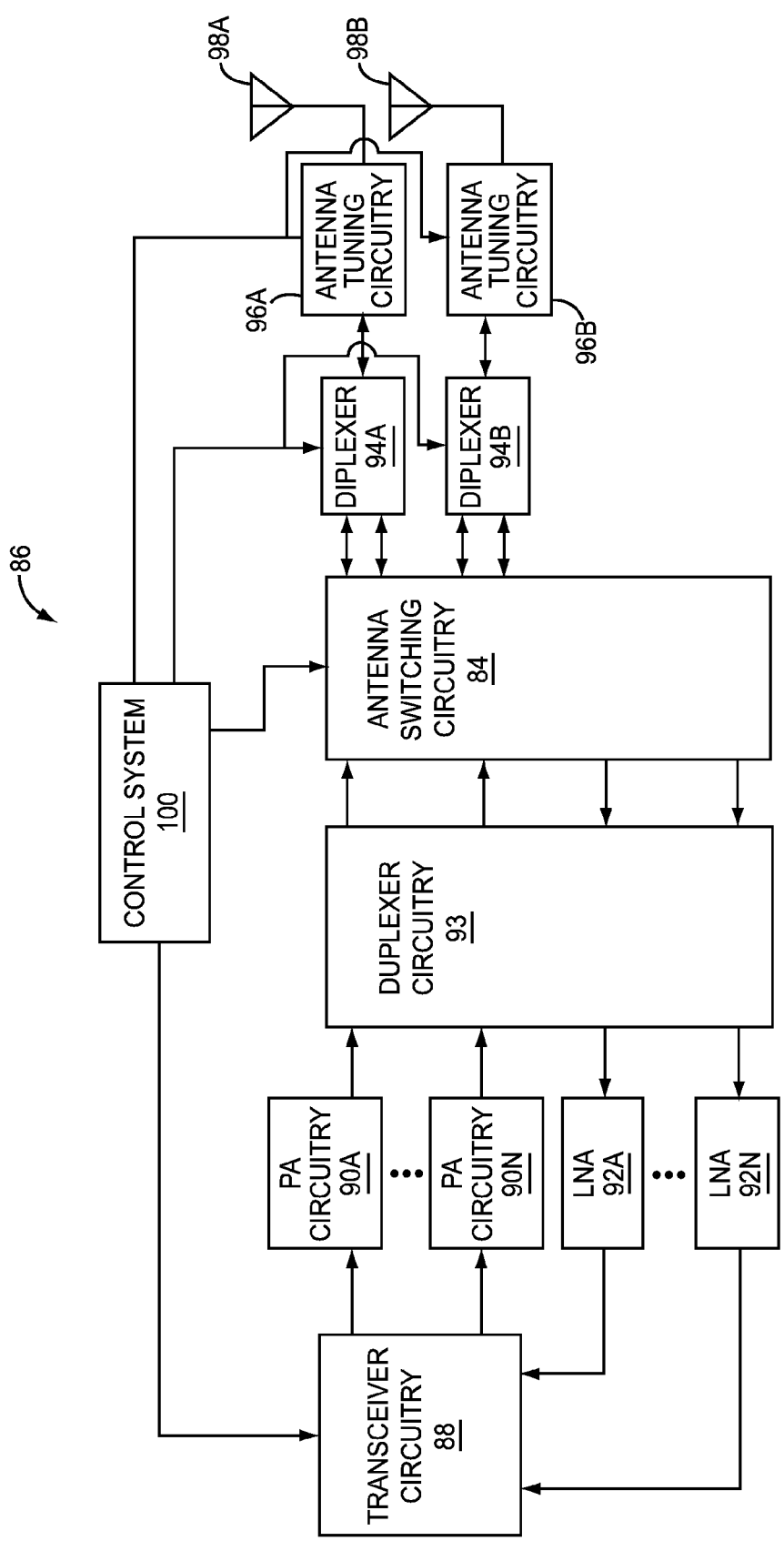
FIG. 6 is a block diagram of front end circuitry according to one embodiment of the present disclosure.

Turning now to FIG. 6, a first embodiment of antenna switching circuitry 84 is incorporated into a mobile terminal front end 86. The basic architecture of the mobile terminal front end 86 includes transceiver circuitry 88, a plurality of power amplifiers 90A-90N, a plurality of low noise amplifiers 92A-92N, duplexer circuitry 93, the antenna switching circuitry 84, a first diplexer 94A, a second diplexer 94B, first antenna tuning circuitry 96A, second antenna tuning circuitry 96B, a first antenna 98A, a second antenna 98B, and control circuitry 100. When receiving a signal, the mobile terminal front end 86 receives information bearing radio frequency signals at the first antenna 98A and the second antenna 98B from one or more remote transmitters provided by a base station (not shown). The radio frequency signals pass through the antenna tuning circuitry 96 to the diplexers 94, where the signals are separated into their low band and high band components and delivered to the antenna switching circuitry 84. The antenna switching circuitry 84 selectively couples one or more terminals of the first diplexer 94A, the second diplexer 94B, or both, to one or more of the plurality of low noise amplifiers 92A-92N through the duplexer circuitry 93. One or more of the plurality of low noise amplifiers 92A-92N amplify the received components of the radio frequency signals and deliver them to the transceiver circuitry 88, where they may be subsequently processed and used by the mobile terminal front end 86.

On the transmit side, the transceiver circuitry 88 receives digitized data, which may represent voice, data, or control information. The encoded data is modulated to produce a carrier signal at a desired transmit frequency. The carrier signal is then delivered to one or more of the plurality of power amplifiers 90A-90N, where it is amplified and delivered to the antenna switching circuitry 84 through the duplexer circuitry 93. The antenna switching circuitry 84 selectively couples one or more output terminals of the duplexer circuitry 93 to one or more terminals of the first diplexer 94A, the second diplexer 94B, or both, depending on the mode of operation of the mobile terminal front end 86. The carrier signal is then filtered by the first diplexer 94A, the second diplexer 94B, or both, and delivered through the antenna tuning circuitry 96 to the first antenna 98A, the second antenna 98B, or both, depending on the mode of operation of the mobile terminal front end 86.

By arranging the antenna switching circuitry 84 such that a diplexer exists between each one of the antennas 98 and the antenna switching circuitry 84, harmonics of the carrier signal are filtered by the diplexers, thereby avoiding the desensitization of receive circuitry within the transceiver circuitry 88. For example, the antenna switching circuitry 84 illustrated in FIG. 6 is usable in a carrier aggregation configuration using bands 3 and 8 (CA 3-8). When transmitting on band 8, the transceiver circuitry 88 will modulate a carrier signal from 880-915 MHz. The carrier signal will pass through one or more of the plurality of power amplifiers 90A-90N, where it will be amplified and delivered to the antenna switching circuitry 84. The antenna switching circuitry 84 will selectively place the carrier signal into communication with the first diplexer 94A or the second diplexer 94B. Due to non-linearity of the switching components, the antenna switching circuitry 84 will generate harmonic distortion about the carrier signal. As the carrier signal is passed through either the first diplexer 94A, the second diplexer 94B, or both, the harmonic distortion is effectively filtered. Accordingly, the signal at the output of the first diplexer 94A, the second diplexer 94B, or both, does not fall within high pass band of each one of the diplexers 94, and therefore is not passed back to the antenna switching circuitry 84. Accordingly, desensitization of the receive circuitry for band 3 is avoided, and the signal passed to the first antenna 98A, the second antenna 98B, or both, is virtually free of harmonic distortion as a result of the antenna switching circuitry 84. A similar result occurs in carrier aggregation configurations using bands 4 and 17 (CA 4-17), in devices simultaneously using band 13 and the GPS band, in devices simultaneously using band 26 and the 2.4 GHz ISM band, and in devices using GSM900 and GSM850 modes, as well as any other combination of operating bands.

According to one embodiment, the first diplexer 94A, the second diplexer 94B, or both may be tunable. By using tunable diplexers for the first diplexer 94A, the second diplexer 94B, or both, harmonic signals about the carrier signal may be further reduced or eliminated. For example, by tuning a stop band in the first diplexer 94A, the second diplexer 94B, or both, to attenuate harmonic signals about the carrier signal, desensitization of the receive circuitry within the transceiver circuitry 88 may be further avoided, as will be discussed in further detail below. Additionally, the first diplexer 94A, the second diplexer 94B, or both, may be tuned to minimize insertion loss in the signal path of the antennas 98, as will be discussed in further detail below.

The control circuitry 100 may be in communication with the antenna switching circuitry 84, the transceiver circuitry 88, the diplexers 94, and the antenna tuning circuitry 96 in order to control one or more operating parameters of the mobile terminal front end 86. For example, the control circuitry 100 may be adapted to place the mobile terminal front end 86 into a diversity mode of operation, wherein the mobile terminal front end 86 is adapted to transmit and receive signals on the first antenna 98A while using the second antenna 98B as a diversity antenna. The control circuitry 100 may also be adapted to place the mobile terminal front end 86 into a multiple input multiple output (MIMO) mode of operation, whereby different signals are transmitted and received by the first antenna 98A and the second antenna 98B simultaneously. The control circuitry 100 may be further adapted to control one or more operating parameters of the first diplexer 94A, the second diplexer 94B, or both. For example, the control circuitry 100 may be adapted to operate the first diplexer 94A, the second diplexer 94B, or both, such that harmonic distortion about the carrier signal is attenuated. Alternatively, the control circuitry 100 may be adapted to operate the first diplexer 94A, the second diplexer 94B, or both, such that insertion loss from the diplexers 94 is reduced.

The antenna tuning circuitry 96 may be configured to ensure optimal operation of the antennas 98 over a wide bandwidth. Although the antenna tuning circuitry 96 may contain one or more switching elements, these switching elements are not adapted to selectively couple the antennas 98 to one of a plurality of RF front end ports within the mobile terminal front end 86.

The duplexer circuitry 93 may be adapted to separate transmit and receive signals such that transmit signals are passed from the power amplifier circuitry 90A-90N to the antenna switching circuitry 84, and receive signals are passed from the antenna switching circuitry 84 to the appropriate low noise amplifier in the plurality of low noise amplifiers 92A-92N. The duplexer circuitry 93 may comprise a plurality of surface acoustic wave (SAW) duplexers, a plurality of bulk acoustic wave (BAW) duplexers, or the like.

According to one embodiment, the antenna switching circuitry 84 is adapted to perform antenna swapping while introducing minimal distortion into a transmit or receive signal. For example, the antenna switching circuitry 84 may be adapted to selectively place one or more of the power amplifiers 90A-90N in communication with either the first antenna 98A or the second antenna 98B based upon an efficiency associated with each antenna. The efficiency may be based, for example, on electrical measurements and/or environmental conditions. Examples of electrical measurements include a reflected transmit power measured by one or more directional couplers, a received signal strength measurement, or a transmit power measured by a base station. Examples of environmental conditions include feedback from one or more sensors to detect the orientation of the mobile device and feedback from sensors that detect how the mobile device is being held.

Figure 7:
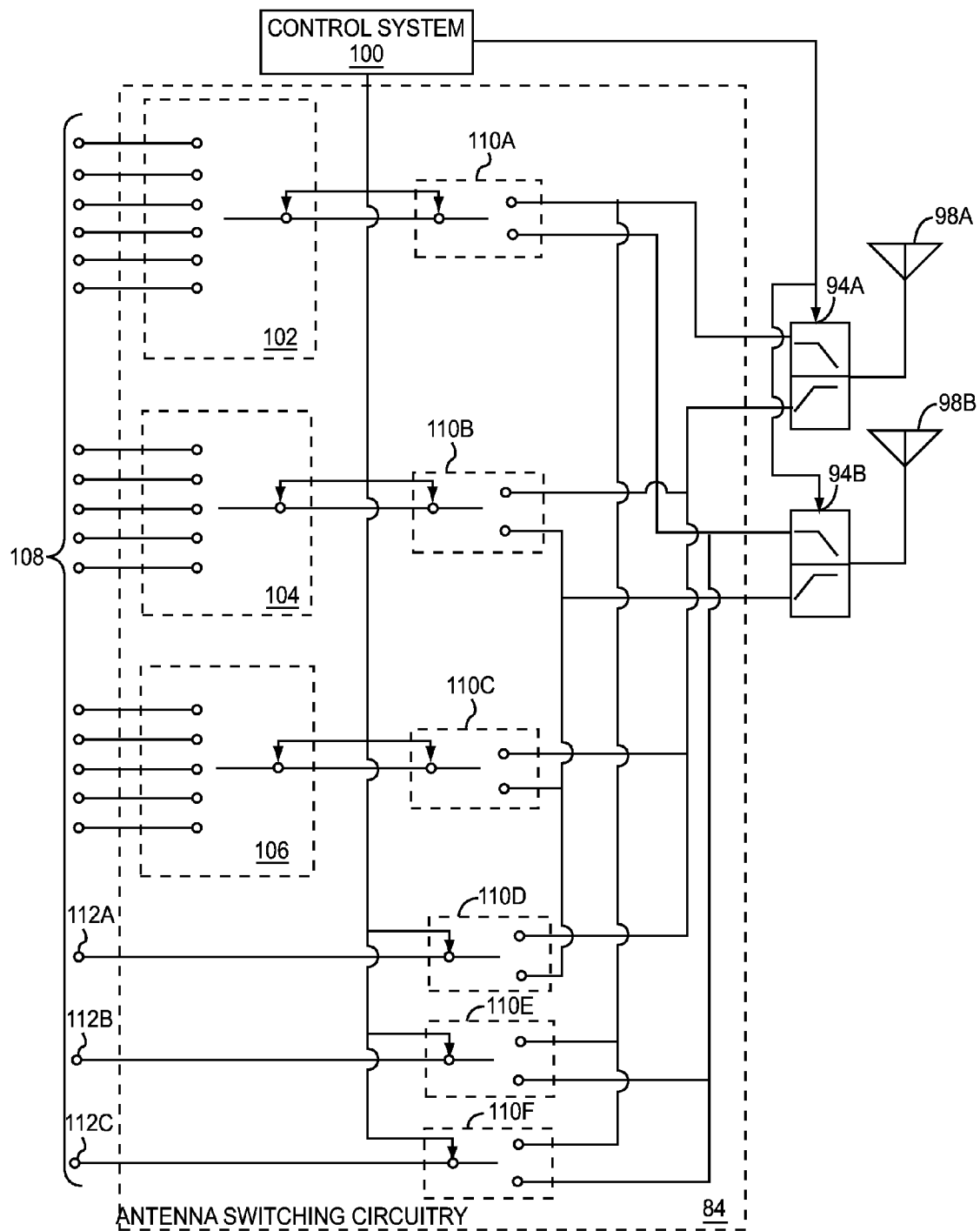
FIG. 7 is a schematic representation of front end switching circuitry according to one embodiment of the present disclosure.

FIG. 7 shows a schematic representation of the antenna switching circuitry 84 according to one embodiment of the present disclosure. For context, the control circuitry 100, the first diplexer 94A, the second diplexer 94B, the first antenna 98A, and the second antenna 98B are also shown. The antenna switching circuitry 84 includes low band switching circuitry 102, first high band switching circuitry 104, second high band switching circuitry 106, a plurality of RF front end ports 108, and a plurality of antenna selection switches 110. The low band switching circuitry 102, the first high band switching circuitry 104, and the second high band switching circuitry 106 may comprise single pole multi throw (SPMT) switches adapted to selectively couple one or more of the RF front end ports 108 to one of the plurality of antenna selection switches 110. Each one of the plurality of antenna selection switches 110 may comprise a single pole dual throw (SPDT) switch adapted to selectively couple one of the RF front end ports 108 to either the first antenna 98A through the first diplexer 94A or the second antenna 98B through the second diplexer 94B.

According to one embodiment, one or more of the antenna selection switches 110 may be directly coupled to one of the plurality of RF front end ports, such as the RF front end ports 112A-112C shown in FIG. 7. The RF front end ports 112A-112C may be coupled to further switching circuitry (not shown) in order to implement additional functionality of the mobile terminal front end 86 (shown in FIG. 6), such as, for example, a diversity or a MIMO mode of operation.

Although 19 RF front end ports are shown in FIG. 7, any number of RF front end ports may be used according to the present disclosure. Further switching circuitry for selectively coupling the additional RF front end ports to the antennas 98 or for otherwise supporting additional modes of operation may also be included without departing from the principles of the present disclosure. For example, additional high band or low band switching circuitry may be added in order to support extra bands.

According to one embodiment, each one of the switches in the antenna switching circuitry 84 is coupled to the control circuitry 100 such that the control system determines the connection path of each one of the switches.

According to an additional embodiment, the first diplexer 94A, the second diplexer 94B, or both are tunable, as will be discussed in further detail below. The control circuitry 100 may be coupled to each one of the diplexers 94 in order to alter one or more operating parameters of the diplexers 94. For example, the control circuitry 100 may be adapted to operate the first diplexer 94A, the second diplexer 94B, or both, such that harmonic distortion about the carrier signal is attenuated. Alternatively, the control circuitry 100 may be adapted to operate the first diplexer 94A, the second diplexer 94B, or both, such that insertion loss from the diplexers 94 is reduced.

Figure 8:
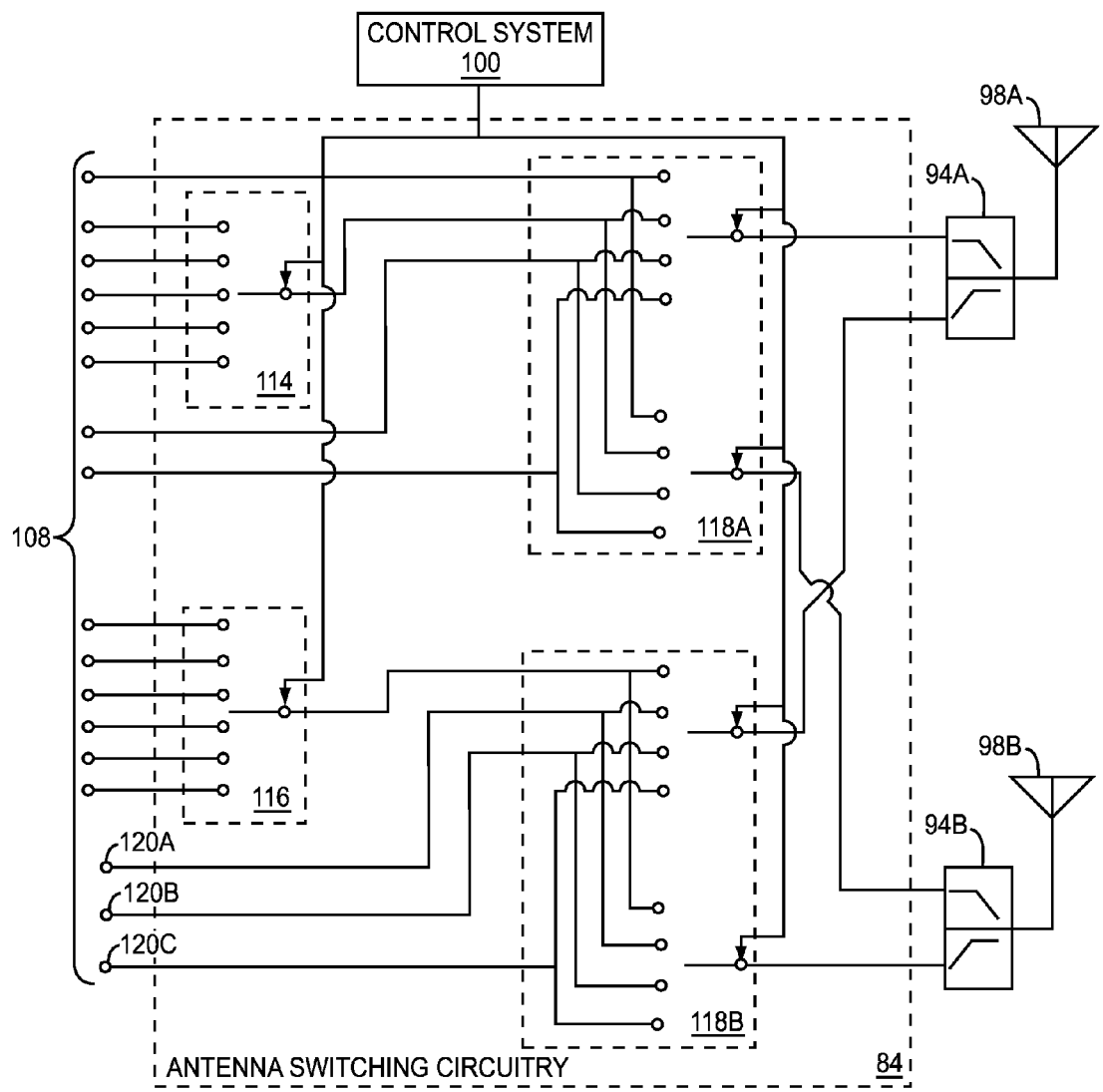
FIG. 8 is a schematic representation of front end switching circuitry according to an additional embodiment of the present disclosure.

FIG. 8 shows a schematic representation of the antenna switching circuitry 84 according to an additional embodiment of the present disclosure. For context, the first diplexer 94A, the second diplexer 94B, the first antenna 98A, and the second antenna 98B are also shown. The antenna switching circuitry 84 includes low band switching circuitry 114, high band switching circuitry 116, low band antenna selection circuitry 118A, and high band antenna selection circuitry 118B. The low band switching circuitry 114 and the high band switching circuitry 116 may comprise SPMT switches adapted to selectively couple one or more of the RF front end ports 108 to the low band antenna selection circuitry 118A or the high band antenna selection circuitry 118B, respectively. The low band antenna selection circuitry 118A and the high band antenna selection circuitry 118B may comprise a dual pole four throw (DP4T) switch adapted to selectively couple one of the RF front end ports 108 to either the first antenna 98A through the first diplexer 94A or the second antenna 98B through the second diplexer 94B.

According to one embodiment, one or more of the antenna selection switches 110 may be directly coupled to one of the RF front end ports 108, such as the RF front end ports 120A-120C shown in FIG. 8. The RF front end ports 120A-120C may be coupled to further switching circuitry (not shown) in order to implement additional functionality of the mobile terminal front end 86 (shown in FIG. 6), such as, for example, a diversity or a MIMO mode of operation.

By arranging the antenna switching circuitry 84 such that a diplexer exists between each one of the antennas 98 and the antenna switching circuitry 84, harmonics about the carrier signal are filtered by the diplexers, thereby avoiding the desensitization of receive circuitry within the transceiver circuitry 88 (shown in FIG. 6), as is discussed above.

Although 17 RF front end ports are shown in FIG. 8, any number of RF front end ports may be used according to the present disclosure. Further antenna switching circuitry for selectively coupling the additional RF front end ports to the antennas 98 or for otherwise supporting additional modes of operation may also be included without departing from the principles of the present disclosure. For example, additional high band or low band switching circuitry may be added in order to support extra bands According to one embodiment, each one of the switches in the antenna switching circuitry 84 is coupled to the control circuitry 100 such that the control system determines the connection path of each one of the switches.

According to an additional embodiment, the first diplexer 94A, the second diplexer 94B, or both, are tunable, as will be discussed in further detail below. The control circuitry 100 may be coupled to each one of the diplexers 94 in order to alter one or more operating parameters of the diplexers 94. For example, the control circuitry may be adapted to operate the first diplexer 94A, the second diplexer 94B, or both, such that harmonic distortion about the carrier signal is attenuated. Alternatively, the control circuitry 100 may be adapted to operate the first diplexer 94A, the second diplexer 94B, or both, such that insertion loss from the diplexers 94 is reduced.

Figure 9:
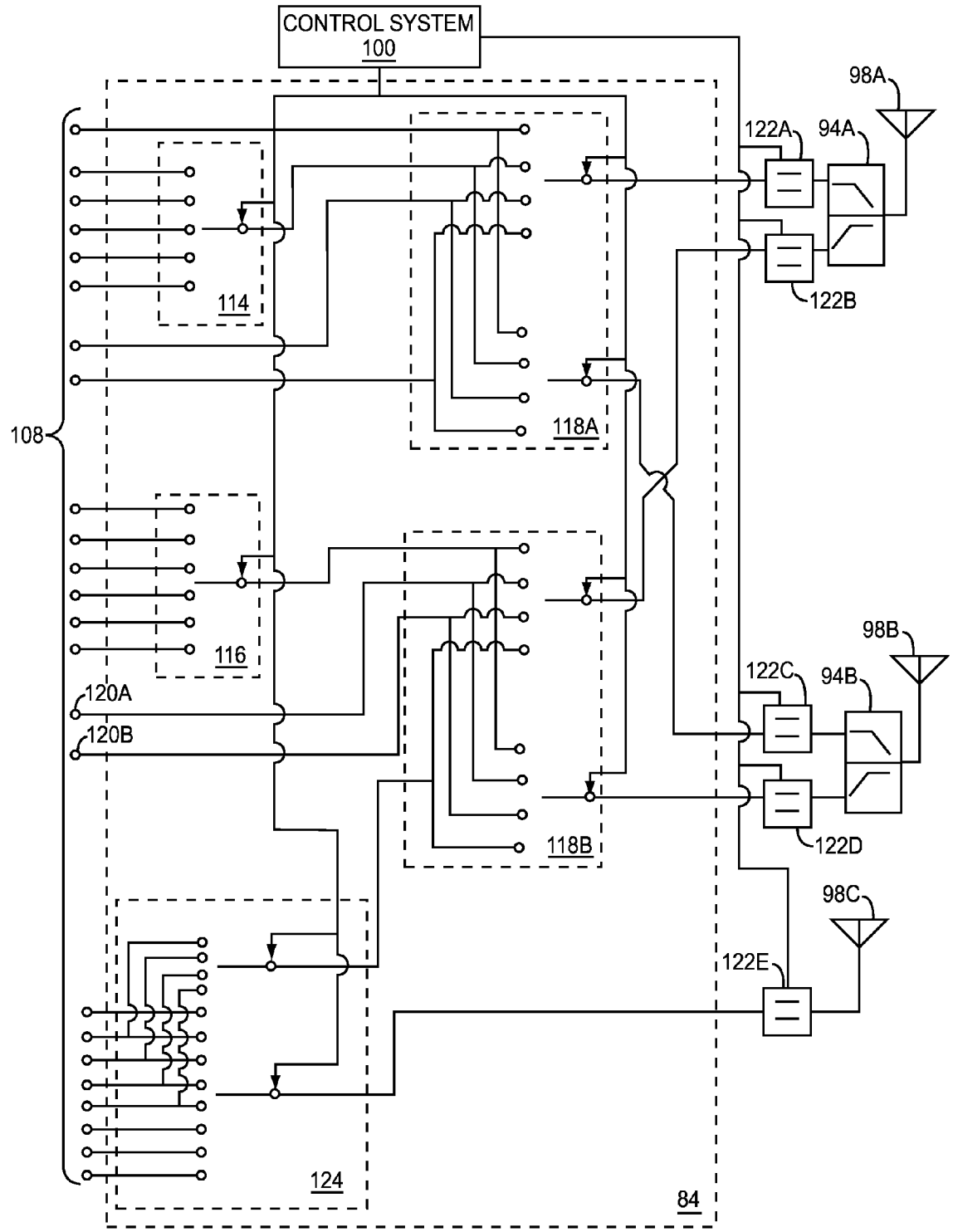
FIG. 9 is a schematic representation of front end switching circuitry according to an additional embodiment of the present disclosure.

FIG. 9 shows a schematic representation of the antenna switching circuitry 84 according to an additional embodiment of the present disclosure. For context, the first diplexer 94A, the second diplexer 94B, the first antenna 98A, and the second antenna 98B are also shown. The antenna switching circuitry 84 of FIG. 9 is adapted to operate three antennas 98. Accordingly, a third antenna 98C is shown. The antenna switching circuitry 84 is substantially similar to that described in FIG. 8, with the addition of a plurality of directional couplers 122A-122E and a third antenna selection circuitry 124 for operating the mobile terminal front end 86 (shown in FIG. 6) with three antennas 98. The third antenna selection circuitry 124 may comprise a dual pole multiple throw (DPMT) switch adapted to selectively place one of the plurality of RF front end ports 108 in communication with the third antenna 98C and the high band antenna selection circuitry 118B. The third antenna selection circuitry 124 may be coupled to the control circuitry 100 such that the control circuitry 100 determines the selected RF front end port to present to the third antenna 98C and the high band antenna selection circuitry 118B. By arranging the antenna switching circuitry 84 such that a diplexer exists between each one of the antennas 98 and the antenna switching circuitry 84, the desensitization of receive circuitry within the transceiver circuitry 88 (shown in FIG. 6) can be avoided in carrier aggregation applications across all bands, as discussed above.

Although 24 RF front end ports are shown in FIG. 9, any number of RF front end ports may be used according to the present disclosure. Further switching circuitry for selectively coupling the additional RF front end ports to the antennas 98 or for otherwise supporting additional modes of operation may also be included without departing from the principles of the present disclosure. For example, additional high band or low band switching circuitry may be added in order to support extra bands.

According to one embodiment, each one of the switches in the antenna switching circuitry 84 is coupled to the control circuitry 100 such that the control system determines the connection path of each one of the switches.

According to an additional embodiment, the first diplexer 94A, the second diplexer 94B, or both are tunable, as will be discussed in further detail below. The control circuitry 100 may be coupled to each one of the diplexers 94 in order to alter one or more operating parameters of the diplexers 94. For example, the control circuitry may be adapted to operate the first diplexer 94A, the second diplexer 94B, or both, such that harmonic distortion about the carrier signal is attenuated. Alternatively, the control circuitry 100 may be adapted to operate the first diplexer 94A, the second diplexer 94B, or both, such that insertion loss from the diplexers 94 is reduced.

According to an additional embodiment, the antenna switching circuitry 84 further includes the plurality of directional couplers 122A-122E in order to direct the flow of RF signals between the antenna switching circuitry 84 and the antennas 98. The plurality of directional couplers 122 may be connected between each port of the first diplexer 94A and the antenna switching circuitry 84, between each port of the second diplexer 94B and the antenna switching circuitry 84, and between the third antenna 98C and the antenna switching circuitry 84. Each one of the plurality of directional couplers 122 may be connected to the control circuitry 100 such that the control circuitry 100 determines the direction of the signal flow through each one of the plurality of directional couplers 122.

Figure 10:
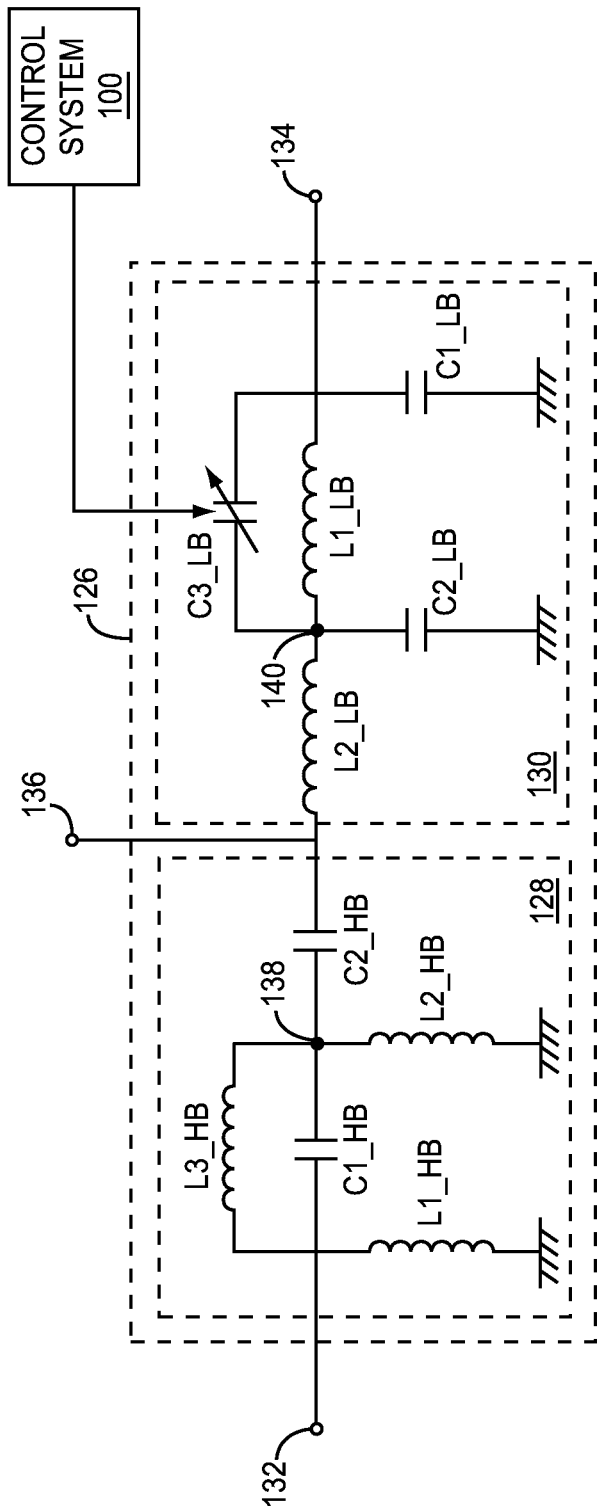
FIG. 10 is a schematic representation of a tunable diplexer according to one embodiment of the present disclosure.

FIG. 10 shows a schematic representation of a tunable diplexer 126 according to the present disclosure. The tunable diplexer 126 is based at least in part on an elliptical response, and includes a high pass filter 128, a low pass filter 130, a high band port 132, a low band port 134, and an antenna port 136. The high pass filter 128 includes a first high band inductor L1_HB coupled between the high band port 132 and ground, a first high band capacitor C1_HB coupled between the high band port 132 and a first high band node 138, a second high band inductor L2_HB coupled between the first high band node 138 and ground, a second high band capacitor C2_HB coupled between the first high band node 138 and the antenna port 136, and a third high band inductor L3_HB coupled between the high band port 132 and the first high band node 138. The low pass filter includes a first low band capacitor C1_LB coupled between the low band port 134 and ground, a first low band inductor L1_LB coupled between the low band port 134 and a first low band node 140, a second low band capacitor C2_LB coupled between the first low band node 140 and ground, a second low band inductor L2_LB coupled between the first low band node 140 and the antenna port 136, and a third low band capacitor C3_LB coupled between the low band port 134 and the first low band node 140.

The tunable diplexer 126 is adapted to pass high band signals falling within a high pass band between the antenna port 136 and the high band port 132, pass low band signals within a low pass band between the antenna port 136 and the low band port 134, and attenuate signals outside of the high and low pass bands. The tunable diplexer 126 includes a tunable low band path stop band zero that is controllable by adjusting the capacitance of the third low band capacitor C3_LB. In one mode of operation, the tunable diplexer 126 is adjusted to selectively attenuate signals passing through the tunable diplexer 126. The selective attenuation of signals may be especially useful in certain carrier aggregation applications.

As an example, in a carrier aggregation configuration using bands 8 and 3 (CA 8-3), the tunable low band path stop band zero can be tuned to the second harmonic of the band 8 transmit signal in order to ensure that any harmonic distortion generated by the antenna switching circuitry will not desensitize the receiver circuitry. Such a tuning configuration may be useful in both carrier aggregation and non-carrier aggregation configurations wherein harmonic distortion generated about a transmission signal may desensitize the receive circuitry or otherwise interfere with the functionality of the device. For example, tuning the low band path stop band zero to attenuate harmonic distortion may be useful in carrier aggregation configurations using bands 4 and 17 (CA 4-17), in devices simultaneously using band 13 and the GPS band, in devices simultaneously using band 26 and the 2.4 GHz ISM band, and in devices using GSM900 and GSM850 modes. By tuning the low band path stop band zero to attenuate troublesome harmonic signals, the tunable diplexer 126 may prevent desensitization of receiver circuitry within a mobile device, and allow for greater flexibility in the operation of the device.

In an additional mode of operation of the tunable diplexer 126, the tunable diplexer 126 may be adapted to minimize insertion loss at the active transmit or receive frequencies. For example, the low band path stop band zero may be tuned to minimize insertion loss in a non-carrier aggregation configuration, or in a carrier aggregation configuration in which there are no concerns regarding harmonic distortion and desensitization of the receive circuitry.

According to one embodiment, the control circuitry 100 is in communication with the third low band capacitor C3_LB in order to control the variable capacitance value of the capacitor. The control circuitry 100 may be adapted to place the tunable diplexer 126 in a mode of operation to minimize problematic harmonics. The control circuitry 100 may also be adapted to place the tunable diplexer 126 in a mode of operation to minimize insertion loss.

According to one embodiment, the first diplexer 94A, the second diplexer 94B, or both (shown in FIGS. 6-9) comprise the tunable diplexer 126 illustrated in FIG. 10.

Figure 11:
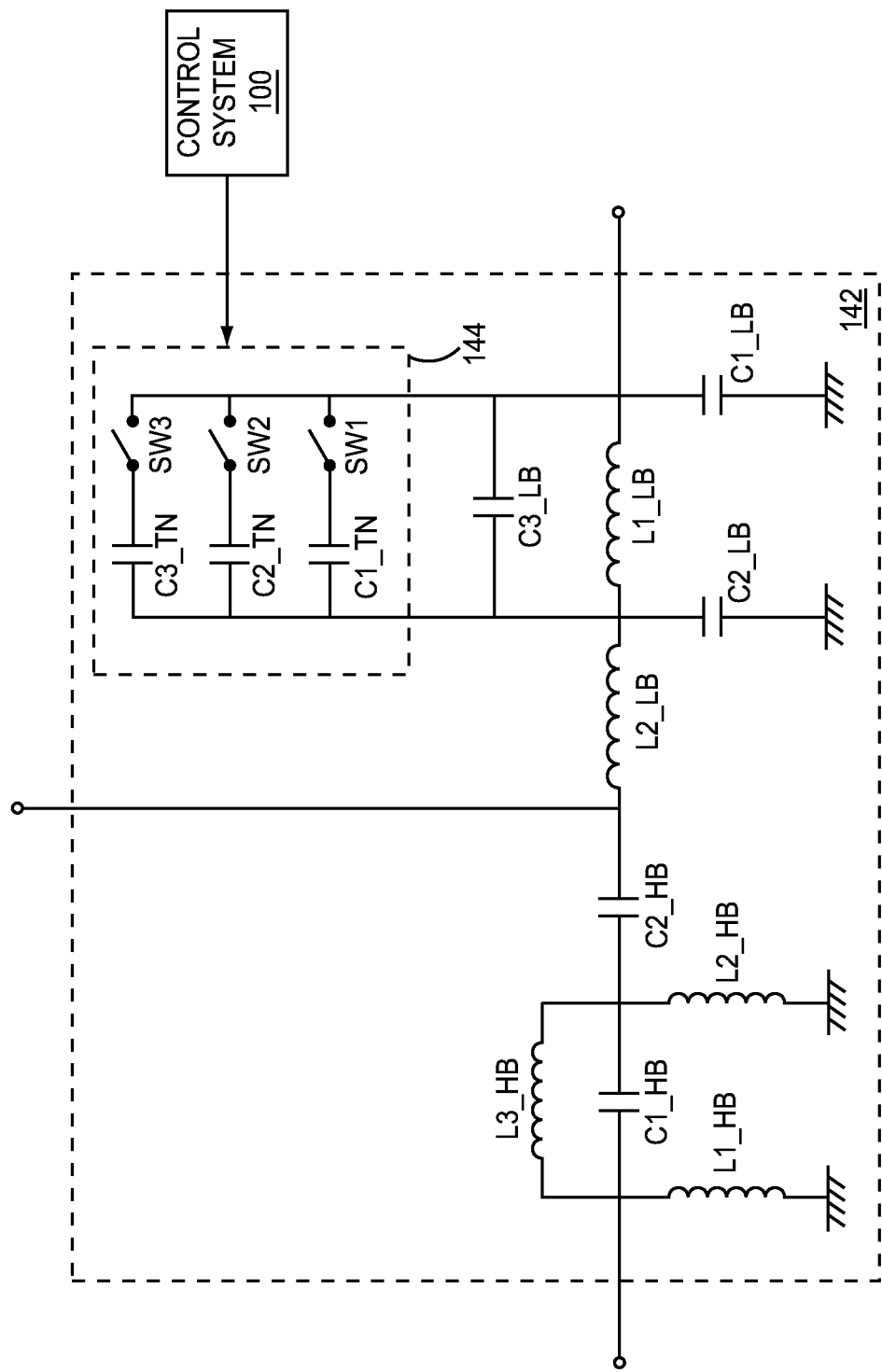
FIG. 11 is a schematic representation of a tunable diplexer according to one embodiment of the present disclosure.

FIG. 11 shows a schematic representation of an additional embodiment of a tunable diplexer 142 according to the present disclosure. For context, the control circuitry 100 is also shown. The tunable diplexer 142 shown in FIG. 11 is substantially similar to that shown in FIG. 10, further including a programmable array of capacitors (PAC) 144 for tuning the low band path stop band zero. Although three capacitors are shown in the PAC 144, any number of capacitors may be used to tune the low band path stop band zero according to the present disclosure. The PAC 144 may include a first tuning capacitor C1_TN, a second tuning capacitor C2_TN, and a third tuning capacitor C3_TN. Each of the capacitors may be coupled in series with a switch SW1-SW3. Further, each one of the capacitors and switches may be coupled in parallel with the third low band capacitor C3_LB. By selectively turning the switches SW1-SW3 on and off, the capacitance between the low band port 134 and the first low band node 140 can be altered. Accordingly, the low band path stop band zero can be tuned according to the mode of operation of the tunable diplexer 142.

Although FIG. 11 shows a PAC 144 for tuning the low band path stop band zero, any low band filter circuit topology including any tunable component with a filter response including a tunable zero may be used in the tunable diplexer 142, as will be appreciated by those of ordinary skill in the art.

According to one embodiment, the control circuitry 100 is in communication with the PAC 144 in order to control the orientation of the switches SW1-SW3. The control circuitry 100 may be adapted to place the tunable diplexer 142 in a mode of operation to minimize problematic harmonics. The control circuitry 100 may also be adapted to place the tunable diplexer 142 in a mode of operation to minimize insertion loss.

According to one embodiment, the first diplexer 94A, the second diplexer 94B, or both (shown in FIGS. 6-9) comprise the tunable diplexer 126 illustrated in FIG. 11.

Figure 12:
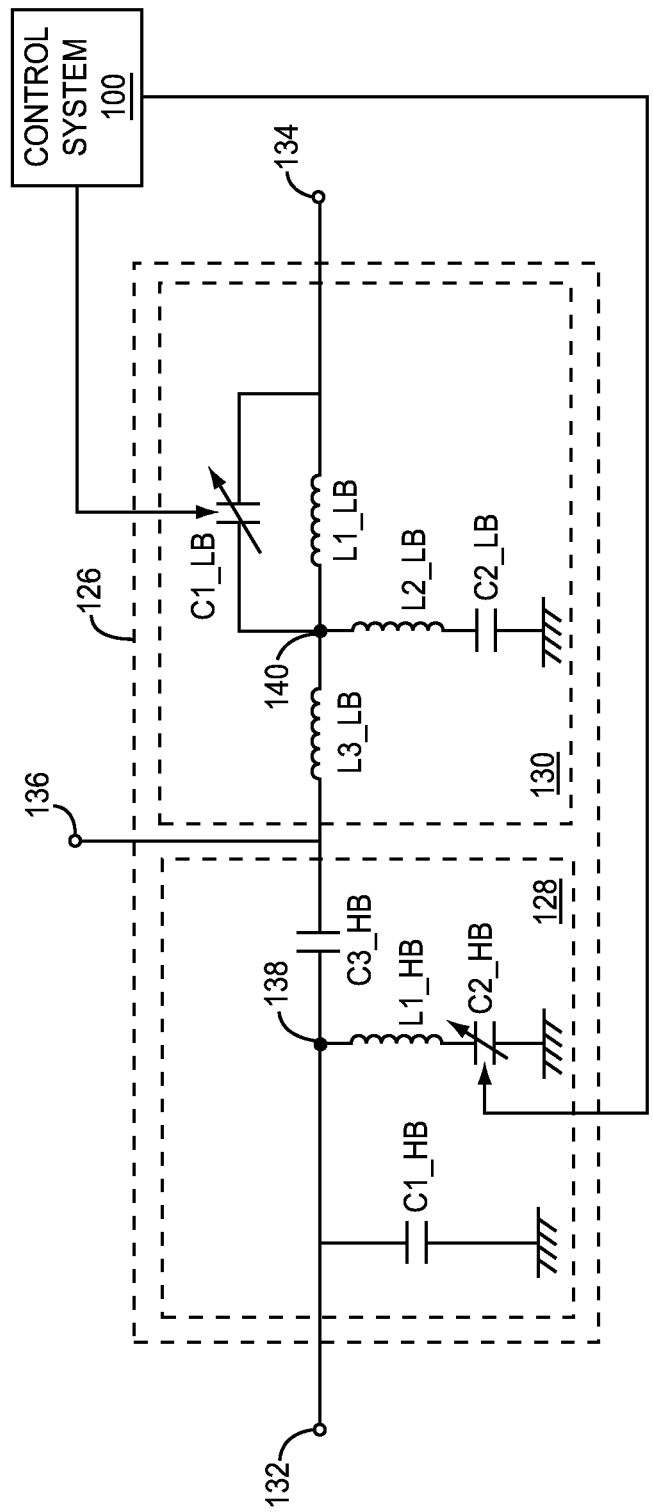
FIG. 12 is a schematic representation of a tunable diplexer according to an additional embodiment of the present disclosure.

FIG. 12 shows the tunable diplexer 126 according to an additional embodiment of the present disclosure. For context, the control circuitry 100 is also shown. The tunable diplexer 126 shown in FIG. 12 includes the high pass filter 128, the low pass filter 130, the high band port 132, the low band port 134, and the antenna port 136. The high pass filter 128 includes a first high band capacitor C1_HB coupled between the high band port 132 and ground, a first high band inductor L1_HB and a second high band capacitor C2_HB coupled in series between the first high band node 138 and ground, and a third high band capacitor C3_HB coupled between the first high band node 138 and the antenna port 136. The low pass filter 130 includes a first low band capacitor C1_LB coupled in parallel with a first high band inductor L1_LB between the low band port 134 and the first low band node 140, a second low band inductor L2_LB and a second low band capacitor C2_LB coupled in series between the first low band node 140 and ground, and a third low band inductor L3_LB coupled between the first low band node 140 and the antenna port 136.

As shown in FIG. 12, the tunable diplexer 126 is based on a relatively simple filter response. Simplifying the filtering components of the tunable diplexer 126 results in a significant reduction in the insertion loss thereof. However, such a reduction in insertion loss comes at the expense of filter performance. In order to compensate for the decrease in performance due to the simplification of the tunable diplexer 126, the second high band capacitor C2_HB and the first low band capacitor C1_LB are adjustable in order to provide tunable stop bands, as discussed in detail below. Using the second high band capacitor C2_HB and the first low band capacitor C1_LB to adjust one or more stop bands in the tunable diplexer 126 allows the tunable diplexer 126 to maintain a relatively low insertion loss while simultaneously providing the necessary attenuation of signals passing through the tunable diplexer 126.

As discussed above, the tunable diplexer 126 is configured to pass high band signals within a high pass band between the antenna port 136 and the high band port 132, pass low band signals within a low pass band between the antenna port 136 and the low band port 134, and attenuate signals outside of the high and low pass bands, respectively. Further, the second high band capacitor C2_HB and the first low band capacitor C1_LB are adjustable. Accordingly, the tunable diplexer 126 includes a high band path stop band zero that is controllable by adjusting the capacitance of the second high band capacitor C2_HB, and a low band path stop band zero that is controllable by adjusting the capacitance of the first low band capacitor C1_LB. In one mode of operation, the high stop band path stop band zero, the low stop band path stop band zero, or both, may be adjusted to selectively attenuate signals passing through the tunable diplexer 126. The selective attenuation may be especially useful in certain carrier aggregation applications.

As an example, in a carrier aggregation configuration using bands 8 and 3 (CA 8-3), the high band path stop band zero can be tuned to the fundamental frequency of the band 8 transmit signal (i.e., from 880-915 MHz) in order to provide additional isolation of the receiver circuitry from the low band transmit signal. Further, the low band path stop band zero can be tuned to the second harmonic of the band 8 transmit signal in order to ensure that any harmonic distortion generated by the antenna switching circuitry will not desensitize the receiver circuitry. Such a tuning configuration may be useful in both carrier aggregation and non-carrier aggregation configurations. As an additional example, tuning the low band path stop band zero and the high band path stop band zero may also be useful in carrier aggregation configurations using bands 4 and 17 (CA 4-17). In this configuration, the high band path stop band zero may be tuned to the fundamental frequency of the band 17 transmit signal (i.e., from 704-716 MHz) in order to provide additional isolation of the receiver circuitry from the low band transmit signal. Further, the low band path stop band zero may be tuned to the third harmonic of the band 17 transmit signal in order to ensure that any harmonic distortion generated by the antenna switching circuitry will not desensitize the receiver circuitry. The tunable diplexer 126 may also be beneficial in devices simultaneously using band 13 and the GPS band, in devices simultaneously using band 26 and the 2.4 GHz ISM band, and in devices using GSM900 and GSM850 modes. By tuning the low band path stop band zero and the high band path stop band zero as described, the tunable diplexer 126 may prevent desensitization of receiver circuitry within a mobile device, and allow for greater flexibility in the operation of the device.

In an additional mode of the tunable diplexer 126, the tunable diplexer 126 may be operated to minimize insertion loss at the active transmit or receive frequencies. For example, the low band path stop band zero and/or the high band path stop band zero may be tuned to minimize insertion loss in a non-carrier aggregation configuration, or in a carrier aggregation configuration in which there is a reduced need for the additional attenuation provided by the high band path stop band zero and/or the low band path stop band zero.

In one embodiment, the control circuitry 100 is in communication with the second high band capacitor C2_HB and the first low band capacitor C1_LB in order to control the variable capacitance value of each one of the capacitors. The control circuitry 100 may thus tune the high band path stop band zero and/or the low band path stop band zero to provide additional attenuation as required.

Further, the control circuitry 100 may thus place the tunable diplexer 126 in a mode of operation to minimize insertion loss.

According to one embodiment, the first diplexer 94A, the second diplexer 94B, or both (shown in FIGS. 6-9) may comprise the tunable diplexer 126 illustrated in FIG. 12.

Figure 13:
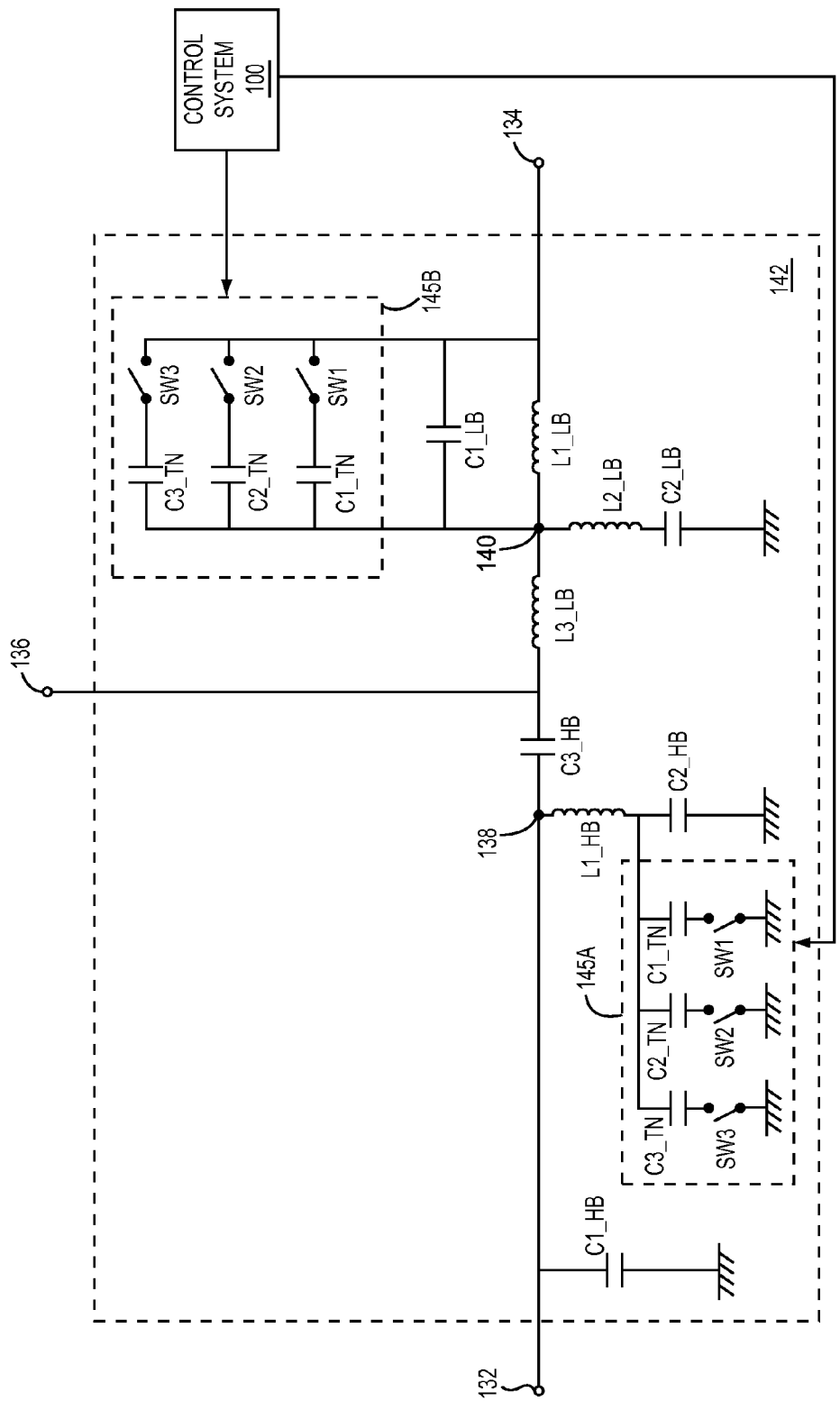
FIG. 13 is a schematic representation of a tunable diplexer according to an additional embodiment of the present disclosure.

FIG. 13 shows the tunable diplexer 126 according to an additional embodiment of the present disclosure. For context, the control circuitry 100 is also shown. The tunable diplexer 126 shown in FIG. 13 is substantially similar to that shown in FIG. 12, but includes a high band path PAC 145A and a low band path PAC 145B for tuning the high band path stop band zero and the low band path stop band zero, respectively. Although three capacitors are shown in each one of the high band path PAC 145A and the low band path PAC 145B, any number of capacitors may be used to tune the high band path PAC 145A and the low band path PAC 145B without departing from the principles of the present disclosure. Each one of the high band path PAC 145A and the low band path PAC 145B may include a first tuning capacitor C1_TN, a second tuning capacitor C2_TN, and a third tuning capacitor C3_TN. Each of the tuning capacitors may be coupled in series with a switch SW1-SW3. Further, each capacitor-switch pair may be coupled in parallel with the second high band capacitor C2_HB or the first low band capacitor C1_LB, respectively. By selectively turning the switches SW1-SW3 on and off, the capacitance between the first high band node 138 and ground and the capacitance between the low band port 134 and the first low band node 140 may be changed. Accordingly, the high band path stop band zero and the low band path stop band zero can be adjusted according to the mode of operation of the tunable diplexer 126.

Although FIG. 13 shows a PAC 145 for tuning the high band path stop band zero and the low band path stop band zero, any filter circuit topology including any tunable component with a filter response including a tunable zero may be used in the tunable diplexer 126 without departing from the principles described herein.

According to one embodiment, the control circuitry 100 is in communication with the high band path PAC 145A and the low band path PAC 145B in order to control the orientation of the switches SW1-SW3. The control circuitry 100 may control the orientation of the switches SW1-SW3 for the high band path PAC 145A and the low band path PAC 145B either independently or together. The control circuitry 100 may thus be configured to place the tunable diplexer 126 in a mode of operation to provide additional attenuation. Further, the control circuitry 100 may thus be configured to place the tunable diplexer 126 in a mode of operation to reduce insertion loss.

Figure 14:
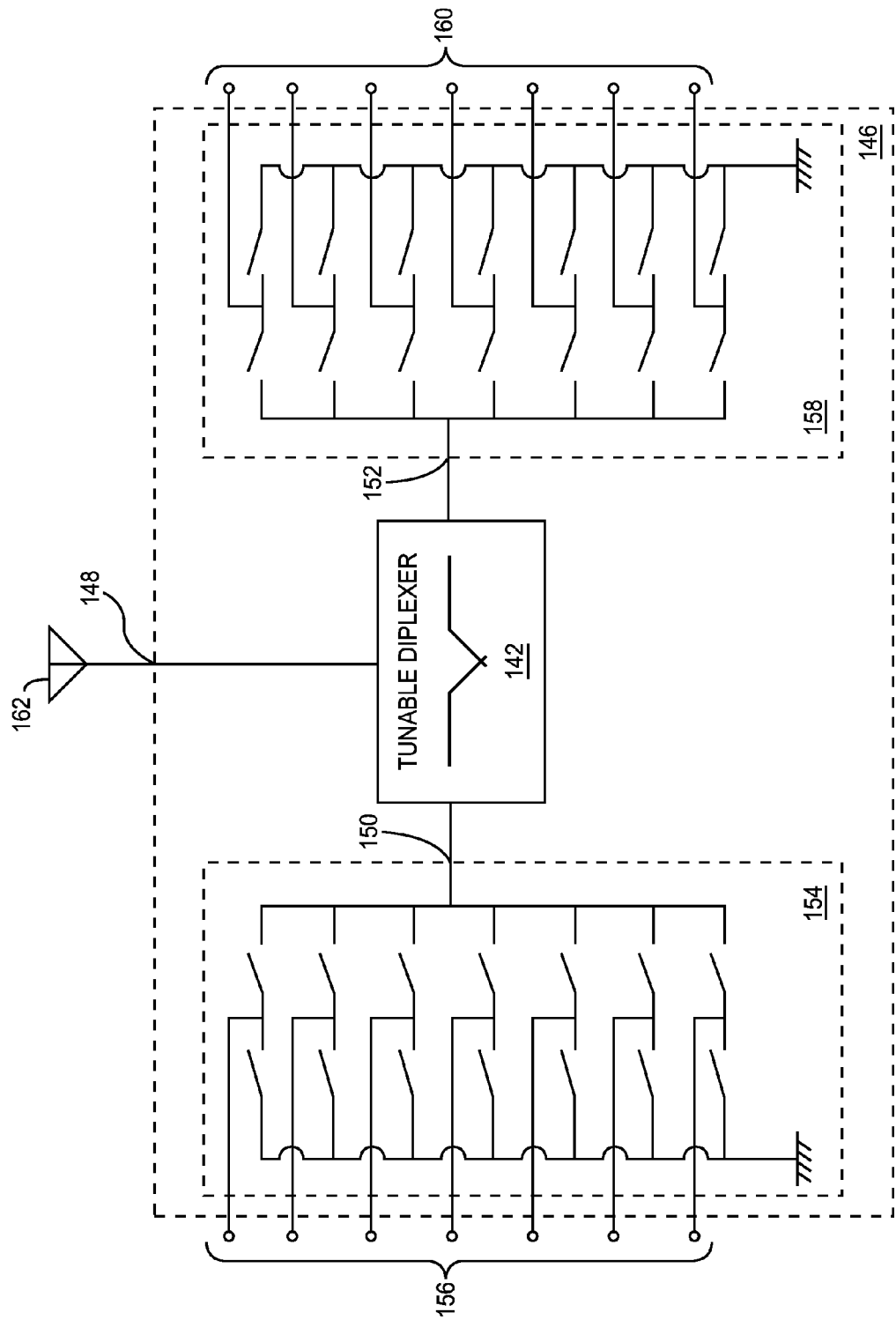
FIG. 14 is a schematic representation of an integrated tunable diplexer according to one embodiment of the present disclosure.

FIG. 14 shows a schematic representation of an integrated tunable diplexer 146 according to the present disclosure. The integrated tunable diplexer 146 includes the tunable diplexer 142 including an antenna port 148, a high band port 150, and a low band port 152, high band switching circuitry 154, a plurality of high band RF front end ports 156, low band switching circuitry 158, a plurality of low band switching ports 160, and an antenna 162. As discussed above, the tunable diplexer 142 is adapted to route high band signals falling within a high pass band between the high band switching circuitry 154 and the antenna 162, route low band signals falling within a low pass band between the low band switching circuitry 158 and the antenna 162, and attenuate signals outside of the high and low pass bands.

According to one embodiment, the integrated diplexer is formed on a single semiconductor die. By forming the tunable diplexer 142 and the switching circuitry on a single semiconductor die, space can be saved in a mobile device into which the integrated tunable diplexer 146 is integrated. Further, by forming the integrated tunable diplexer 146 on a single semiconductor die, the high band switching circuitry 154 and the low band switching circuitry 158 can be used as adjustable tuning elements to alter the performance of the tunable diplexer 142. Generally, the impedance of the unused high band port 150 and the unused low band port 152 are terminated by a 50 ohm impedance. However, by adjusting the termination impedance of the high band port 150, the low band port 152, or both using one or more of the switches in the high band switching circuitry 154, the low band switching circuitry 158, or both, the high pass band, the low pass band, or both, can be tuned.

For example, by terminating the low band port 152 of the tunable diplexer 142 in an open circuit, the high pass band may be shifted slightly lower in frequency. Such a shift in frequency may have a significant impact on the performance and versatility of a mobile device. By terminating the low band port 152 of the tunable diplexer 142 in an open circuitry and thus shifting the high pass band slightly lower in frequency, additional operating bands within the mobile spectrum may be accommodated without the need for additional components. Such an approach may reduce insertion loss in the signal path of the antenna 162, reduce the cost of a mobile device into which the integrated tunable diplexer 146 is incorporated, and increase the functionality and usability of the mobile device.

According to an additional embodiment, the integrated diplexer includes a combination of silicon on insulator (SOI) semiconductor devices and surface mount devices (SMDs) integrated onto a low temperature co-fired ceramic (LTCC) module.

Those skilled in the art will recognize improvements and modifications to the preferred embodiments of the present disclosure. All such improvements and modifications are considered within the scope of the concepts disclosed herein and the claims that follow.

What is claimed is:

1. Circuitry comprising:
   a tunable diplexer comprising:
      a high band port, a low band port, and an antenna port;
      a high pass filter coupled between the high band port and the antenna port and configured to pass signals within a high pass band between the high band port and the antenna port while attenuating signals outside of the high pass band, wherein the high pass filter includes a tunable high band path stop band zero configured to selectively attenuate signals within a high band path stop band;
      a low pass filter coupled between the low band port and the antenna port and adapted to pass signals within a low pass band between the low band port and the antenna port while attenuating signals outside the low pass band, wherein the low pass filter includes a tunable low band path stop band zero configured to selectively attenuate signals within a low band path stop band; and
   control circuitry coupled to the tunable diplexer and configured to:
      tune the low band path stop band zero such that the low band path stop band encompasses at least one harmonic component of a low band transmit signal provided from the low band port to the antenna port; and
      tune the high band path stop band zero such that the high band path stop band encompasses the low band transmit signal.

2. The circuitry of claim 1 wherein the low band path stop band zero and the high band path stop band zero are tuned such that insertion loss of the tunable diplexer is reduced.

3. The circuitry of claim 1 wherein:
   the high pass filter comprises:
      a first high band capacitor coupled between the high band port and ground;
      a first high band inductor coupled in series with a second high band capacitor between a first high band node and ground; and
      a third high band capacitor coupled between the first high band node and the antenna port;
   the low pass filter comprises:
      a first low band capacitor coupled in parallel with a first low band inductor between the low band port and a first low band node;
      a second low band inductor coupled in series with a second low band capacitor between the first low band node and ground; and
      a third low band inductor coupled between the first low band node and the antenna port.

4. The circuitry of claim 3 wherein:
   a capacitance of the second high band capacitor is adjustable in order to adjust the high band path stop band of the tunable diplexer; and
   a capacitance of the first low band capacitor is adjustable in order to adjust the low band path stop band of the tunable diplexer.

5. The circuitry of claim 4 wherein:
   the second high band capacitor comprises a capacitor in parallel with a first switchable capacitor array; and
   the first low band capacitor comprises a capacitor in parallel with a second switchable capacitor array.

6. The circuitry of claim 5 wherein the control circuitry is coupled to the first switchable capacitor array and the second switchable capacitor array and configured to adjust the capacitance of the first switchable capacitor array and the second switchable capacitor array.

7. The circuitry of claim 1 wherein the tunable diplexer is integrated on a single semiconductor die with front end switching circuitry.

8. The circuitry of claim 7 wherein the front end switching circuitry is configured to selectively couple a plurality of RF front end ports to one or more antennas in a mobile terminal.

9. The circuitry of claim 8 wherein the tunable diplexer is configured to adjust the high pass band and the low pass band by adjusting a termination impedance of one or more of the plurality of RF front end ports coupled to the front end switching circuitry.

10. The circuitry of claim 9 wherein the termination impedance of the one or more of the plurality of RF front end ports is adjusted to be an open circuit.

11. Radio frequency (RF) front end circuitry comprising:
    transceiver circuitry;
    at least one antenna;
    front end switching circuitry configured to selectively couple one or more of a plurality of RF front end ports to the at least one antenna;
    a tunable diplexer coupled between the front end switching circuitry and the at least one antenna, the tunable diplexer comprising:
       a high band port, a low band port, and an antenna port;
       a high pass filter coupled between the high band port and the antenna port and configured to pass signals within a high pass band between the high band port and the antenna port while attenuating signals outside of the high pass band, wherein the high pass filter includes a high band path stop band zero configured to selectively attenuate signals within a high band path stop band; and
       a low pass filter coupled between the low band port and the antenna port and adapted to pass signals within a low pass band between the low band port and the antenna port while attenuating signals outside the low pass band, wherein the low pass filter includes a low band path stop band zero configured to selectively attenuate signals within a low band path stop band;
    power amplifier circuitry coupled between the transceiver circuitry and a first set of the plurality of RF front end ports; and
    low noise amplifier circuitry coupled between the transceiver circuitry and a second set of the plurality of RF front end ports.

12. The RF front end circuitry of claim 11 wherein the high band path stop band zero and the low band path stop band zero are tunable, such that the high band path stop band and the low band path stop band are adjustable.

13. The RF front end circuitry of claim 12 wherein the low band path stop band zero is tuned such that the low band path stop band encompasses one or more harmonic components of a signal passed from the low band port to the antenna port.

14. The RF front end circuitry of claim 12 wherein the high band path stop band zero is tuned such that the high band path stop band encompasses all of a portion of the fundamental frequency of a signal passed from the low band port to the antenna port.

15. The RF front end circuitry of claim 12 wherein the low band path stop band zero and the high band path stop band zero are tuned such that an insertion loss of the tunable diplexer is reduced.

16. The RF front end circuitry of claim 11 wherein:
the high pass filter comprises:
  a first high band capacitor coupled between the high band port and ground;
  a first high band inductor coupled in series with a second high band capacitor between a first high band node and ground; and
  a third high band capacitor coupled between the first high band node and the antenna port;
the low pass filter comprises:
  a first low band capacitor coupled in parallel with a first low band inductor between the low band port and a first low band node;
  a second low band inductor coupled in series with a second low band capacitor between the first low band node and ground; and
  a third low band inductor coupled between the first low band node and the antenna port.

17. The RF front end circuitry of claim 16 wherein:
a capacitance of the second high band capacitor is adjustable in order to adjust the high band path stop band of the tunable diplexer; and
a capacitance of the first low band capacitor is adjustable in order to adjust the low band path stop band of the tunable diplexer.

18. The RF front end circuitry of claim 17 wherein:
the second high band capacitor comprises a capacitor in parallel with a first switchable capacitor array; and
the first low band capacitor comprises a capacitor in parallel with a second switchable capacitor array.

19. The RF front end circuitry of claim 18 wherein control circuitry is coupled to the first switchable capacitor array and the second switchable capacitor array and configured to adjust the capacitance of the first switchable capacitor array and the second switchable capacitor array.

20. The RF front end circuitry of claim 11 wherein the tunable diplexer is integrated on a single semiconductor die with the front end switching circuitry.

21. The RF front end circuitry of claim 20 wherein the front end switching circuitry is configured to selectively couple the plurality of RF front end ports to the antenna in the RF front end circuitry.

22. The RF front end circuitry of claim 21 wherein the tunable diplexer is configured to adjust the high pass band and the low pass band by adjusting a termination impedance of one or more of the plurality of RF front end ports coupled to the front end switching circuitry.

23. The RF front end circuitry of claim 22 wherein the termination impedance of the one or more RF front end ports is adjusted to be an open circuit.

* * * * *